US008750041B2

(12) United States Patent
Georgescu et al.

(10) Patent No.: US 8,750,041 B2
(45) Date of Patent: Jun. 10, 2014

(54) SCALABLE ELECTRICALLY ERASABLE AND PROGRAMMABLE MEMORY

(75) Inventors: Sorin S. Georgescu, San Jose, CA (US);
A. Peter Cosmin, Santa Clara, CA (US);
George Smarandoiu, San Jose, CA (US)

(73) Assignee: Semiconductor Components Industries, LLC, Phoenix, AZ (US)

(*) Notice: Subject to any disclaimer, the term of this patent is extended or adjusted under 35 U.S.C. 154(b) by 331 days.

(21) Appl. No.: 13/365,216

(22) Filed: Feb. 2, 2012

(65) Prior Publication Data

US 2012/0140565 A1    Jun. 7, 2012

Related U.S. Application Data

(63) Continuation-in-part of application No. 12/050,491, filed on Mar. 18, 2008, now Pat. No. 8,139,408, which is a continuation-in-part of application No. 11/470,245, filed on Sep. 5, 2006, now Pat. No. 7,528,436.

(51) Int. Cl.
*G11C 16/04* (2006.01)
*H01L 29/788* (2006.01)
*H01L 27/115* (2006.01)

(52) U.S. Cl.
CPC ...... *G11C 16/0458* (2013.01); *H01L 27/11524* (2013.01)
USPC ............. 365/185.05; 365/185.01; 257/315; 257/316; 257/E29.3; 257/E27.103

(58) Field of Classification Search
CPC ............ H01L 27/115; H01L 27/11517; H01L 27/11524; H01L 27/1156; G11C 16/0408; G11C 16/0433; G11C 16/0441; G11C 16/0458

USPC .............. 257/314–316, E29.3, E27.103; 365/185.01, 185.05, 185.06, 185.11
See application file for complete search history.

(56) References Cited

U.S. PATENT DOCUMENTS

| | | | |
|---|---|---|---|
| 5,364,806 A | 11/1994 | Ma et al. | |
| 5,648,669 A | 7/1997 | Sethi et al. | |
| 5,790,455 A | 8/1998 | Caywood | |
| 5,792,670 A | 8/1998 | Pio et al. | |
| 5,862,082 A | 1/1999 | Dejenfelt et al. | |
| 5,914,514 A | 6/1999 | Dejenfelt et al. | |
| 5,940,324 A | 8/1999 | Chi et al. | |
| 6,040,216 A | 3/2000 | Sung | |
| 6,081,451 A | 6/2000 | Kalnitsky et al. | |
| 6,103,573 A * | 8/2000 | Harari et al. ................. 438/257 |

(Continued)

FOREIGN PATENT DOCUMENTS

WO    2008030897 A2    3/2008

*Primary Examiner* — Allison P Bernstein
(74) *Attorney, Agent, or Firm* — Bever, Hoffman & Harms, LLP; E. Eric Hoffman

(57) ABSTRACT

A non-volatile memory including one or more EEPROM cell pairs. Each EEPROM cell pair includes three transistors and stores two data bits, effectively providing a 1.5 transistor EEPROM cell. An EEPROM cell pair includes a first non-volatile memory transistor connected to a first bit line, a second non-volatile memory transistor connected to a second bit line, and a source access transistor coupled to common source line. The source access transistor includes: a first diffusion region continuous with a source region of the first non-volatile memory transistor and a second diffusion region continuous with a source region of the second non-volatile memory transistor.

18 Claims, 36 Drawing Sheets

(56) References Cited

U.S. PATENT DOCUMENTS

| | | |
|---|---|---|
| 6,107,659 A | 8/2000 | Onakado et al. |
| 6,177,315 B1 | 1/2001 | Bergemont et al. |
| 6,274,898 B1 | 8/2001 | Mehta et al. |
| 6,284,601 B1 | 9/2001 | Hoang |
| 6,420,754 B2 | 7/2002 | Takahashi et al. |
| 6,532,172 B2 * | 3/2003 | Harari et al. ............. 365/185.14 |
| 6,757,196 B1 | 6/2004 | Tsao et al. |
| 6,835,987 B2 | 12/2004 | Yaegashi |
| 6,934,192 B2 | 8/2005 | Tailliet et al. |
| 7,006,381 B2 | 2/2006 | Dormans et al. |
| 7,102,929 B2 * | 9/2006 | Lee et al. ................. 365/185.17 |
| 7,106,628 B2 | 9/2006 | Watanabe |
| 7,148,538 B2 | 12/2006 | Forbes |
| 7,157,771 B2 | 1/2007 | Forbes |
| 7,274,075 B2 | 9/2007 | Yaegashi |
| 7,414,893 B2 | 8/2008 | La Rosa |
| 7,450,418 B2 | 11/2008 | Liao et al. |
| 7,528,436 B2 | 5/2009 | Georgescu et al. |
| 7,547,944 B2 | 6/2009 | Georgescu et al. |
| 7,590,005 B2 | 9/2009 | Hsu et al. |
| 7,920,424 B2 | 4/2011 | Georgescu et al. |
| 8,093,650 B2 | 1/2012 | Georgescu et al. |
| 2003/0057474 A1 | 3/2003 | Ma et al. |
| 2003/0127683 A1 | 7/2003 | Yoo et al. |
| 2003/0127684 A1 | 7/2003 | Yoo et al. |
| 2004/0047217 A1 | 3/2004 | Kamiya |
| 2005/0133851 A1 | 6/2005 | Forbes |
| 2005/0145929 A1 | 7/2005 | Wu et al. |
| 2005/0184337 A1 | 8/2005 | Forbes |
| 2005/0265063 A1 | 12/2005 | Forbes |
| 2007/0020852 A1 | 1/2007 | Umezawa et al. |
| 2007/0183202 A1 | 8/2007 | Yip |
| 2007/0228451 A1 | 10/2007 | Georgescu et al. |
| 2008/0054336 A1 | 3/2008 | Georgescu et al. |
| 2009/0003074 A1 * | 1/2009 | Georgescu et al. ...... 365/185.18 |
| 2010/0039859 A1 | 2/2010 | Mokhlesi et al. |

* cited by examiner

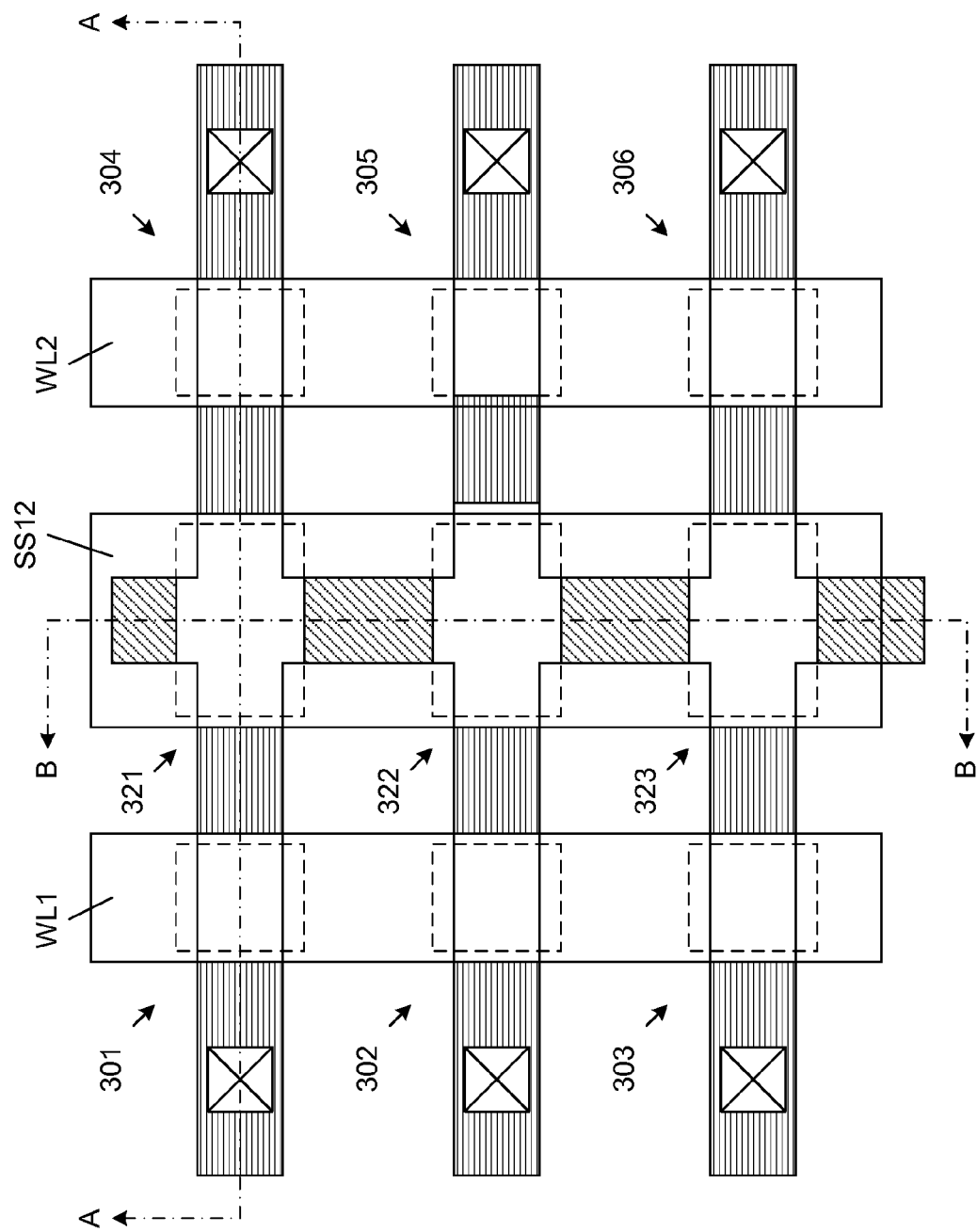

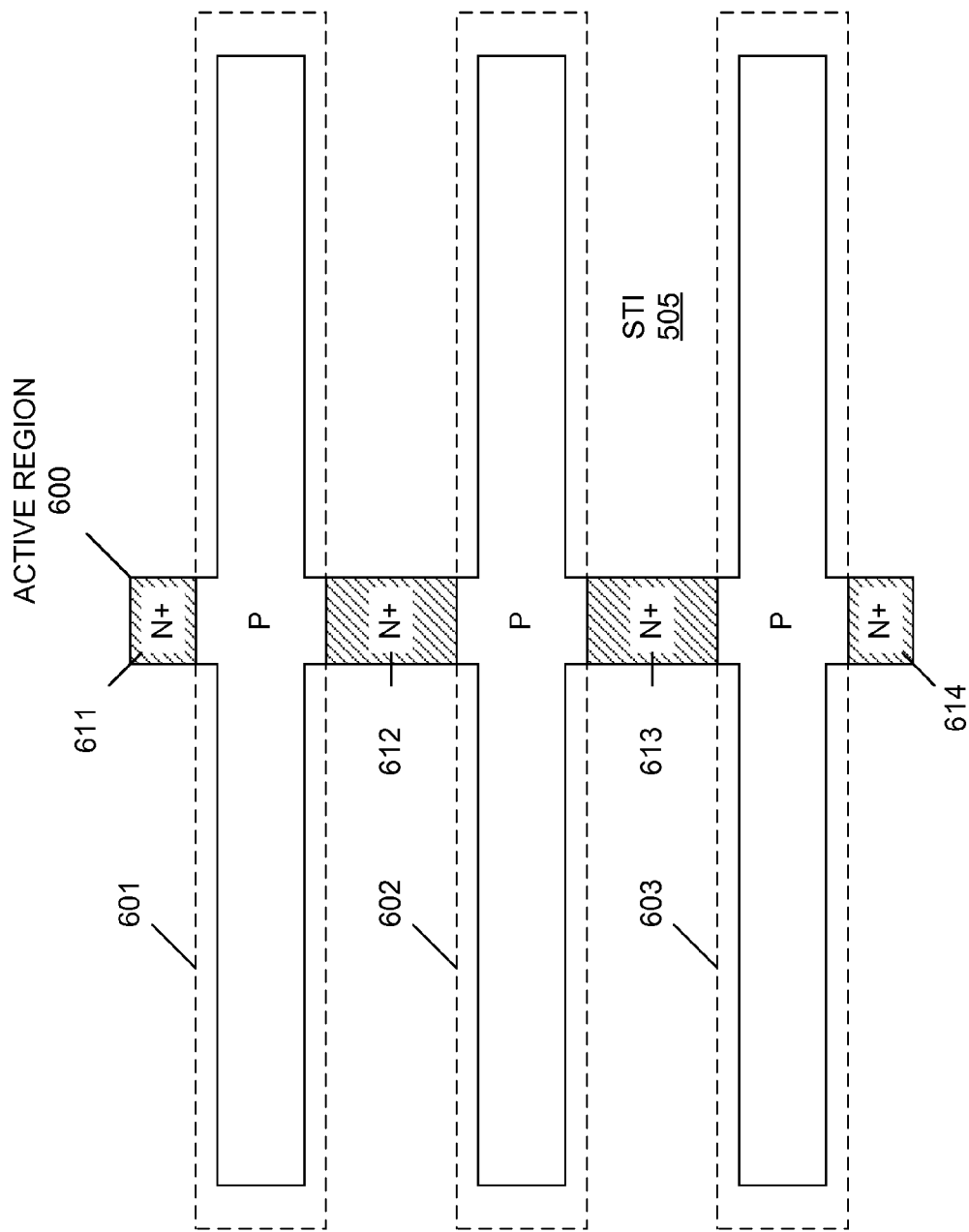

| OPERATION | BL1 | BL2 | BL3 | WL1 | WL2 | WL3 | WL4 | SS12 | SS34 | N-WELL | P-WELL |
|---|---|---|---|---|---|---|---|---|---|---|---|
| ERASE ROW 1 | FLOAT | FLOAT | FLOAT | 0 | $V_{PP}$ | $V_{PP}$ | $V_{PP}$ | $V_{PP}$ | $V_{PP}$ | $V_{PP}$ | $V_{PP}$ |
| ERASE ROWS 1&3 | FLOAT | FLOAT | FLOAT | 0 | $V_{PP}$ | 0 | $V_{PP}$ | $V_{PP}$ | $V_{PP}$ | $V_{PP}$ | $V_{PP}$ |
| PROGRAM 301 | 0 | $V_{INT}$ | $V_{INT}$ | $V_{PP}$ | 0 | 0 | 0 | 0 | 0 | 0 | 0 |
| PROGRAM 301 & 307 | 0 | $V_{INT}$ | $V_{INT}$ | $V_{PP}$ | 0 | $V_{PP}$ | 0 | 0 | 0 | 0 | 0 |
| PROGRAM 301 & 303 | 0 | $V_{INT}$ | 0 | $V_{PP}$ | 0 | 0 | 0 | 0 | 0 | 0 | 0 |
| READ ROW 1 | $V_{R1}$ | $V_{R1}$ | $V_{R1}$ | $V_{DD}$ | 0 | 0 | 0 | $V_{DD}$ | 0 | $V_{R2}$ | 0 |

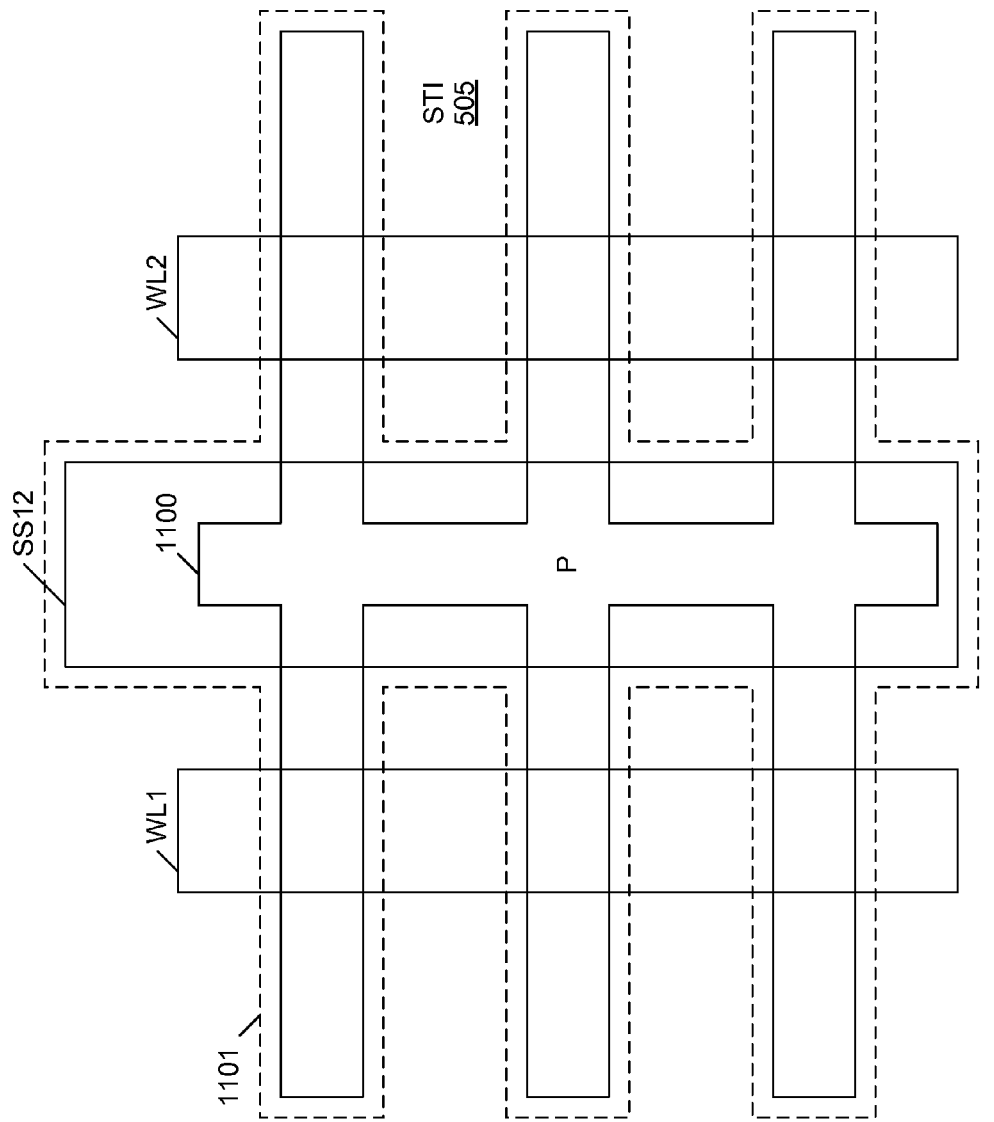

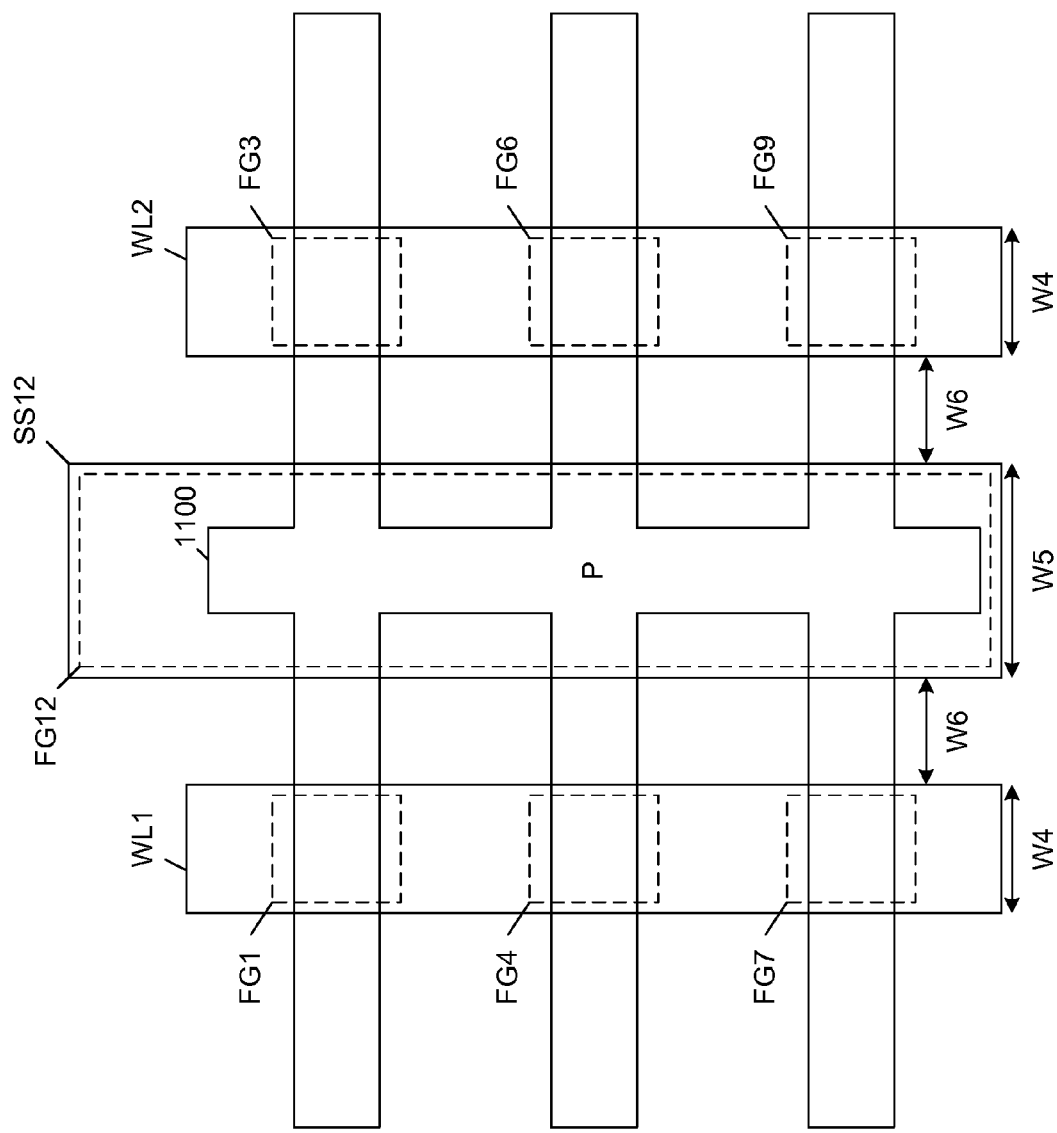

| OPERATION | BL1 | BL2 | BL3 | BLn | WL1 | WL2 | WL3 | WL4 | SS12 | SS34 | N-WELL | P-WELL |
|---|---|---|---|---|---|---|---|---|---|---|---|---|
| ERASE ROW 1 | FLOAT | FLOAT | FLOAT | FLOAT | 0 | $V_{PP}$ | $V_{PP}$ | $V_{PP}$ | $V_{PP}$ | $V_{PP}$ | $V_{PP}$ | $V_{PP}$ |
| ERASE ROWS 1&3 | FLOAT | FLOAT | FLOAT | FLOAT | 0 | $V_{PP}$ | 0 | $V_{PP}$ | $V_{PP}$ | $V_{PP}$ | $V_{PP}$ | $V_{PP}$ |
| PROGRAM 301 | 0 | $V_{INT}$ | $V_{INT}$ | 0 | $V_{PP}$ | 0 | 0 | 0 | 0 | 0 | 0 | 0 |
| PROGRAM 301 & 307 | 0 | $V_{INT}$ | $V_{INT}$ | 0 | $V_{PP}$ | 0 | $V_{PP}$ | 0 | 0 | 0 | 0 | 0 |
| PROGRAM 301 & 303 | 0 | $V_{INT}$ | 0 | 0 | $V_{PP}$ | 0 | 0 | 0 | 0 | 0 | 0 | 0 |
| READ ROW 1 | $V_{R1}$ | $V_{R1}$ | $V_{R1}$ | $V_{R2}$ | $V_{DD}$ | 0 | 0 | 0 | $V_{DD}$ | 0 | 0 | 0 |

| OPERATION | BL1 | BL2 | BL3 | BL4 | BL5 | BL6 | WL1 | WL2 | WL3 | WL4 | SG12 | SG34 | S | NW | PW |
|---|---|---|---|---|---|---|---|---|---|---|---|---|---|---|---|
| ERASE ROW 1 | FL | FL | FL | FL | FL | FL | 0 | $V_{PP}$ | $V_{PP}$ | $V_{PP}$ | $V_{PP}$ | $V_{PP}$ | FL | $V_{PP}$ | $V_{PP}$ |
| ERASE ROWS 1&3 | FL | FL | FL | FL | FL | FL | 0 | $V_{PP}$ | 0 | $V_{PP}$ | $V_{PP}$ | $V_{PP}$ | FL | $V_{PP}$ | $V_{PP}$ |
| PROGRAM ROW 1 | 0/LV | 0 | 0/LV | 0 | 0/LV | 0 | $V_{PP}$ | 0 | 0 | 0 | 0 | 0 | FL | 0 | 0 |
| READ ROW 1 | $V_{R1}$ | 0 | $V_{R1}$ | 0 | $V_{R1}$ | 0 | $V_{RG}$ | 0 | 0 | 0 | $V_{DD}$ | 0 | 0 | 0 | 0 |

SCALABLE ELECTRICALLY ERASABLE AND PROGRAMMABLE MEMORY

RELATED APPLICATION

The present application is a continuation-in-part of pending U.S. patent application Ser. No. 12/050,491 filed Mar. 18, 2008 which is a continuation-in-part of U.S. patent application Ser. No. 11/470,245 filed Sep. 5, 2006, now U.S. Pat. No. 7,528,436.

FIELD OF THE INVENTION

The present invention relates to electrically erasable and programmable memory (EEPROM) cells.

RELATED ART

FIG. 1 is a circuit diagram illustrating a conventional memory system 100 that includes a 2×2 array of electrically erasable and programmable memory (EEPROM) cells 101-104. EEPROM cells 101-104 include CMOS access transistors 111-114, respectively, and non-volatile memory (NVM) transistors 121-124, respectively. The drains of access transistors 111 and 113 are coupled to drain (bit line) terminal D1. Similarly, the drains of access transistors 112 and 114 are coupled to drain (bit line) terminal D2. The sources of access transistors 111-114 are coupled to the drains of NVM transistors 121-124, respectively. The sources of NVM transistors 121-124 are commonly coupled to source terminal S12. The select gates of access transistors 111-112 are commonly connected to select line SL1, and the select gates of access transistors 113-114 are commonly connected to select line SL2. The control gates of NVM transistors 121-122 are commonly connected to control line CL1, and the control gates of NVM transistors 123-124 are commonly connected to control line CL2.

FIG. 2 is a cross sectional view of EEPROM cell 101 and peripheral transistors 201 and 202. Peripheral transistors 201-202 are located on the same chip as EEPROM cells 101-104, and are typically used to access these EEPROM cells. Peripheral transistor 201 includes a source 211, a drain 212, a control gate 210, and a gate dielectric layer 213. Gate dielectric layer 213 has a first thickness T1, which is selected in view of a first voltage used to control the peripheral circuitry. For example, thickness T1 can be 75 Angstroms or less, depending on the process. Similarly, peripheral transistor 202 includes a source 221, a drain 222, a control gate 220, and a gate dielectric layer 223. Gate dielectric layer 223 has a second thickness T2, which is selected in view of a second voltage used to control the peripheral circuitry. For example, thickness T2 can be 300 Angstroms to handle a control voltage of 15 Volts.

Access transistor 111 includes a gate dielectric layer 231 having the second thickness T2. A select gate SG1 is located over this gate dielectric layer 231. NVM transistor 121 includes a gate dielectric layer 232, most of which has a thickness close to the second thickness T2. Dielectric layer 232 includes a thin dielectric tunneling region 233, which has a third thickness T3 of about 100 Angstroms. A floating gate FG1, which stores charge, is located over gate dielectric layer 232 (including tunneling dielectric region 233). The tunneling dielectric region 233 is located over a highly doped N+ region 235, which is an extension of the n-type source/drain diffusion shared by access transistor 111 and NVM transistor 121. An inter-poly dielectric layer 234, having a thickness T4, is located over floating gate FG1. A control gate CG1 is located over the inter-poly dielectric layer 234. The thickness T4 of gate dielectric layer 234 is selected in view of the voltages used to control NVM transistor 121. For example, the dielectric layer 234 can be a composite dielectric (oxide-nitride-oxide) with an equivalent silicon dioxide thickness of about 200 Angstroms to handle programming voltages of about 15 Volts. EEPROM cells 102-104 are identical to EEPROM cell 101.

In order to erase EEPROM cells 101 and 102, a high programming voltage VPP (on the order of about 15 Volts) is applied to the control line CL1 and the select line SL1. The drain terminals D1-D2 and the source terminal S12 are grounded. Under these conditions, the floating gates of NVM transistors 121-122 are coupled to a fraction of the programming voltage VPP, which is enough to produce tunneling currents from the underlying diffusion extension region 235 through the thin gate dielectric region 233. Consequently, the tunneling currents in NVM transistors 121-122, will cause excess electrons to be trapped in the floating gates of these NVM transistors. These trapped electrons increase the threshold voltages of NVM transistors 121-122 (i.e., erase NVM transistors 121-122). EEPROM cells 101-102 can be erased independently of EEPROM cells 103-104. Alternately, EEPROM cells 103-104 can be erased at the same time as EEPROM cells 101-102.

In order to program EEPROM cell 101, the high programming voltage VPP (15 Volts), is applied to the drain terminal D1 and to select line SL1. The control line CL1 and the select line SL2 are grounded. The source terminal S12 and drain D2 are left floating. Under these conditions, access transistor 111 is turned on, and the high programming voltage VPP is applied to the drain extension region 235 of NVM transistor 121. The high voltage across the thin gate dielectric region 233 causes electrons to be removed from the floating gate FG1, thereby causing this transistor to have a relatively low threshold voltage.

The drain of access transistor 111 must have a relatively large active region around the contact in order to properly receive the high programming voltage VPP. In addition, the select gate SG1 of access transistor 111 must be relatively large in order to properly receive the high programming voltage VPP. As a result, access transistor 111 cannot be scaled for processes with feature size of less than 0.35 microns. Similarly, the memory transistor 121 has a large gate area, to accommodate the drain extension diffusion region 235 under the tunneling dielectric region 233. The same limitations apply to access transistors 112-114 and memory transistors 122-124, respectively. It would therefore be desirable to have an EEPROM system that can be scaled to sub−0.35 micron processes.

A few solutions have been presented to extend the applicability of EEPROM-type memories to processes beyond a 0.35 micron process. These solutions permit the shrinking of EEPROM cells by reducing the bitline programming voltage VPP from about 15 to 20 Volts to about 5 Volts. However, these solutions exhibit a number of important drawbacks, including: (i) the memory operation is very complicated, in one case requiring both positive and negative voltages to be applied to the array, (ii) the processes necessary to fabricate these EEPROM memories are also very complicated, thus being prone to difficult yield management, and (iii) the EEPROM cell size is still relatively large and cannot justify the costlier process required to fabricate the array.

Accordingly, it would be desirable to have an improved EEPROM array that overcomes the above-described deficiencies.

BRIEF DESCRIPTION OF THE DRAWINGS

FIG. 4 is a top layout view of the first two rows of the EEPROM array of FIG. 3 in accordance with one embodiment of the present invention.

FIGS. 6A-6G are top layout views of the first two rows of the EEPROM array of FIG. 3 during various stages of fabrication, in accordance with one embodiment of the present invention.

FIG. 7 is a table that summarizes erase, program and read operations of the EEPROM array of FIG. 3 in accordance with various embodiments of the present invention.

FIGS. 11A-11E are top layout views of the first two rows of the EEPROM array of FIG. 9 during various stages of fabrication, in accordance with one embodiment of the present invention.

FIG. 13 is a table that summarizes erase, program and read operations of the EEPROM array of FIG. 12 in accordance with one embodiment of the present invention.

DETAILED DESCRIPTION

Figure 1:
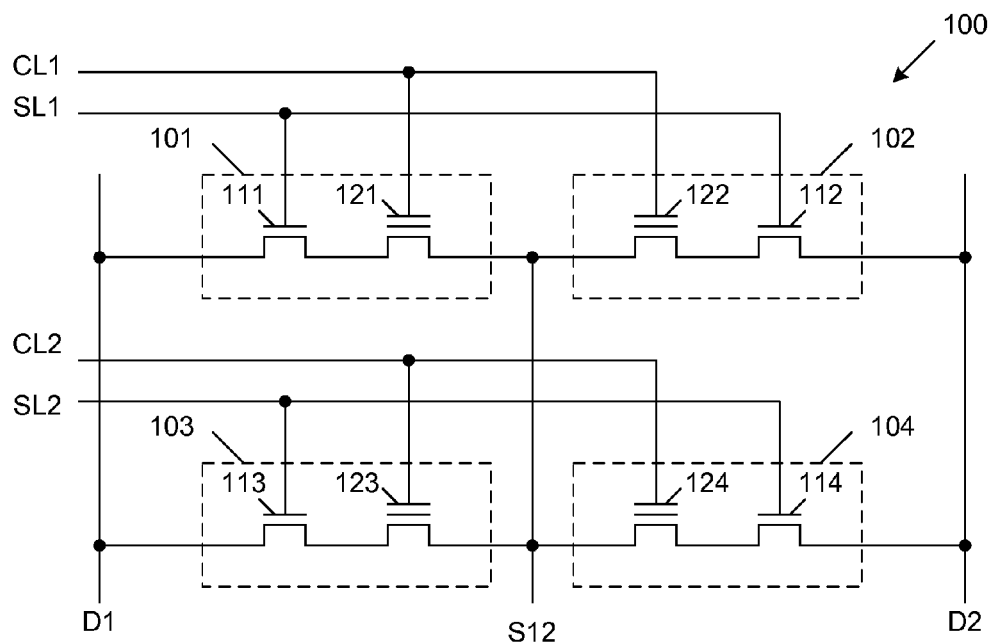
FIG. 1 is a circuit diagram illustrating a conventional memory system that includes an array of electrically erasable and programmable memory (EEPROM) cells.
Figure 2:
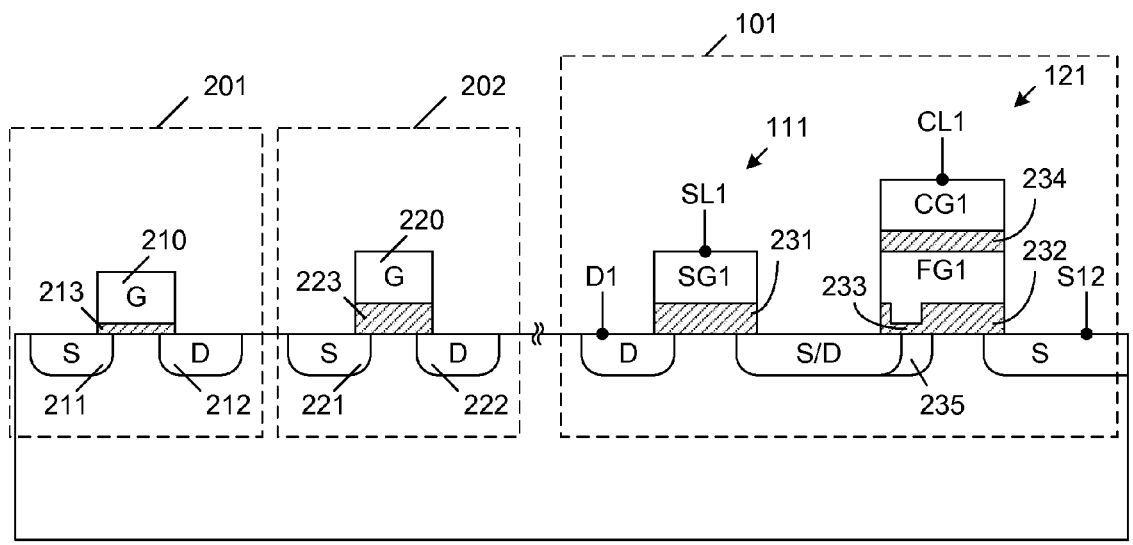
FIG. 2 is a cross sectional view, along the bit line, of two adjacent EEPROM cells of FIG. 1, according to a preferred embodiment.
Figure 3:
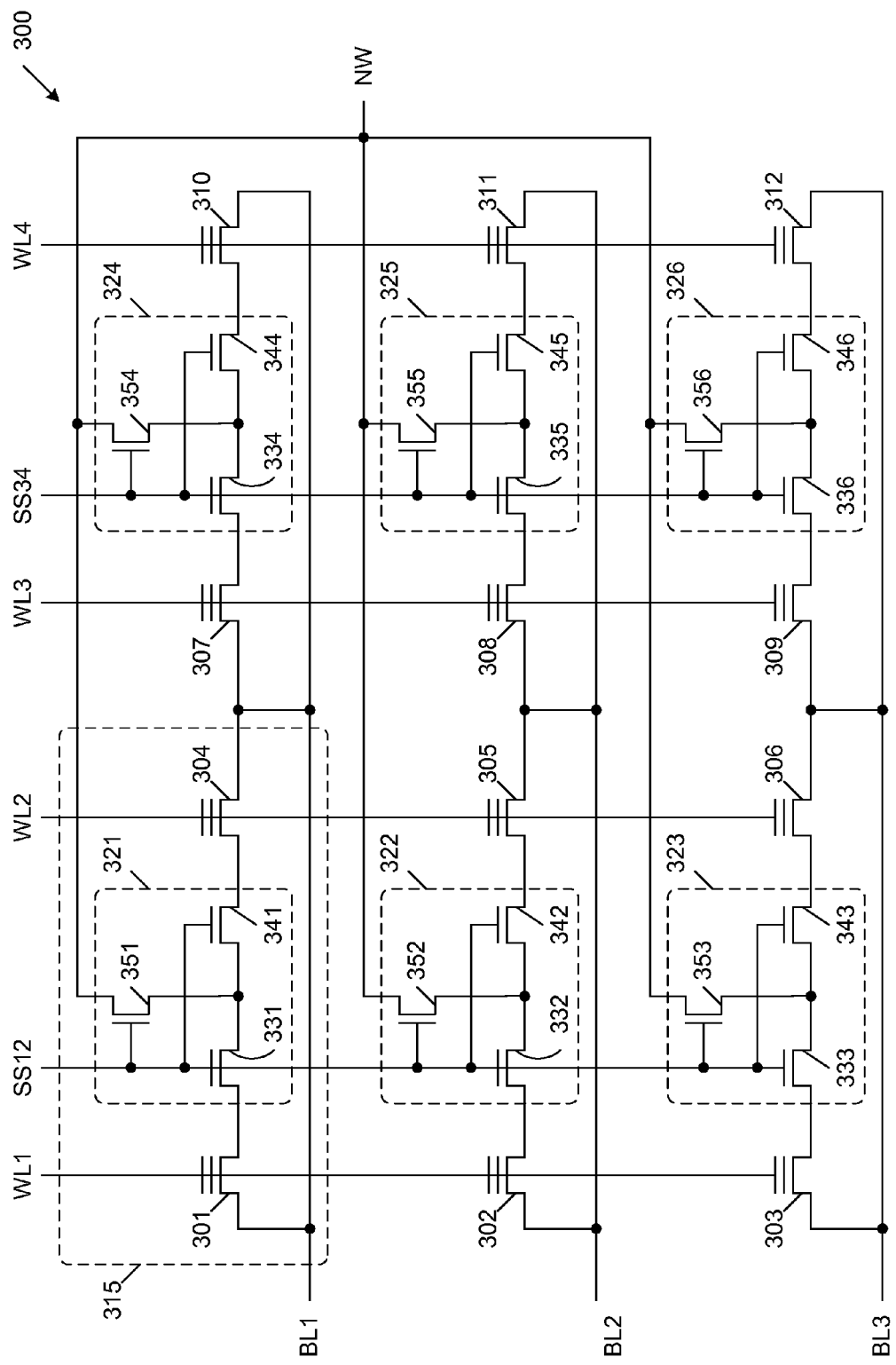
FIG. 3 is a circuit diagram of an array of EEPROM cells in accordance with one embodiment of the present invention.

FIG. 3 is a circuit diagram of an array 300 of EEPROM cells in accordance with one embodiment of the present invention. EEPROM cell array 300 includes floating gate non-volatile memory transistors 301-312, source access transistors 321-326, word lines WL1-WL4, bit lines BL1-BL3, source select lines SS12 and SS34 and N-well connection NW. Source access transistors 321-326 include transistor structures 331-336, respectively, transistor structures 341-346, respectively, and transistor structures 351-356, respectively. As described in more detail below, each of source access transistors 321-326 implements the functionality of three transistor structures using a single transistor.

Memory transistors 301-312 and source access transistors 321-326 are fabricated in a well region having a first conductivity type, which in turn, is located in a well region having a second conductivity type, opposite the first conductivity type. In the described embodiments, memory transistors 301-312 and source access transistors 321-326 are n-channel devices, such that the first well region is a p-well, and the second well region is a deep n-well. However, it us understood that the conductivity types can be reversed in other embodiments. As described in more detail below, transistor structures 351-356 within source access transistors 321-326 are created by forming N+ regions that extend through the p-well region to contact the underlying deep n-well region.

Each of the memory transistors 301-312 belongs to a corresponding EEPROM cell. Thus, array 300 includes twelve EEPROM cells arranged in four rows and three columns. Note that the four rows (corresponding with word lines WL1-WL4) extend along the vertical axis of FIG. 3, while the three rows (corresponding with bit lines BL1-BL3) extend along the horizontal axis of FIG. 3. Although array 300 has four rows and three columns, one of ordinary skill in the art would be able to construct arrays having different dimensions in view of the present disclosure.

Each of the EEPROM cells in array 300 includes a dedicated non-volatile memory transistor and a source access transistor, which is shared with the non-volatile memory transistor of an adjacent EEPROM cell in the same column. In this manner, the EEPROM cells in array 300 are grouped in pairs along the column direction. For example, EEPROM cell pair 315 includes source access transistor 321 and memory transistors 301 and 304. The EEPROM cell located at the first row, first column of array 300 therefore includes memory transistor 301 and source access transistor 321, while the EEPROM cell located at the second row, first column of array 300 includes memory transistor 304 and source access transistor 321. Memory transistor 301 includes a drain coupled to bit line BL1, a control gate coupled to word line WL1, and a source coupled to transistor structure 331 of source access transistor 321. Memory transistor 304 includes a drain coupled to bit line BL1, a control gate coupled to word line WL2, and a source coupled to transistor structure 341 of source access transistor 321. Note that source access transistor 321 is shared by memory transistors 301 and 304. Because memory transistors 301 and 304 share source access transistor 321, each of the EEPROM cells effectively requires 1.5 transistors. Stated another way, EEPROM cell pair 315 stores two bits of data (one bit in each of memory transistors 301 and 304), using three transistors (memory transistors 301 and 304 and source access transistor 321). Thus, on average EEPROM cell pair 315 requires 1.5 transistors to store each bit (i.e., 3 transistors/2 bits). The present invention may therefore be referred to as a 1.5 transistor (1.5T) EEPROM.

Source access transistor 321 is also coupled to an underlying deep N-well region NW by transistor structure 351. As described in more detail below, the underlying deep N-well region serves as a common array source for the EEPROM cells of array 300.

Figure 5A:
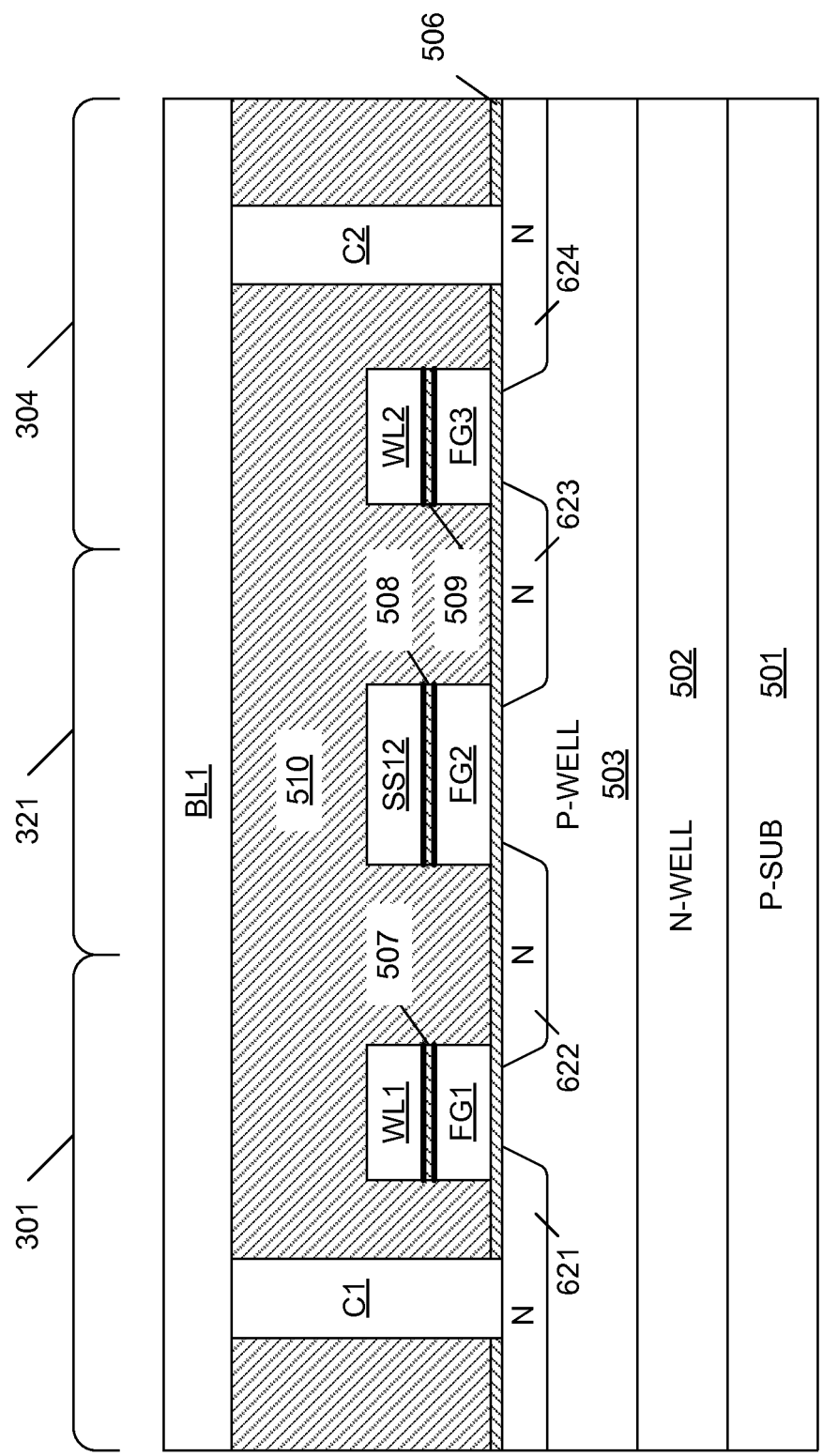
FIG. 5A is a cross-sectional view of an EEPROM cell pair along section line A-A of FIG. 4.

FIG. 4 is a top layout view of the first two rows of array 300, including memory transistors 301-306, source access transistors 321-323, word lines WL1-WL2 and source select line SS12, in accordance with one embodiment of the present invention. The last two rows of array 300 are laid out in the same manner as the first two rows of array 300. Bit lines BL1-BL3 are not shown in FIG. 4 for purposes of clarity (although bit line BL1 is illustrated in FIG. 5A). Additional reference numbers identifying the various regions of FIG. 4 are illustrated in FIGS. 5A-5B and 6A-6G.

Figure 5B:
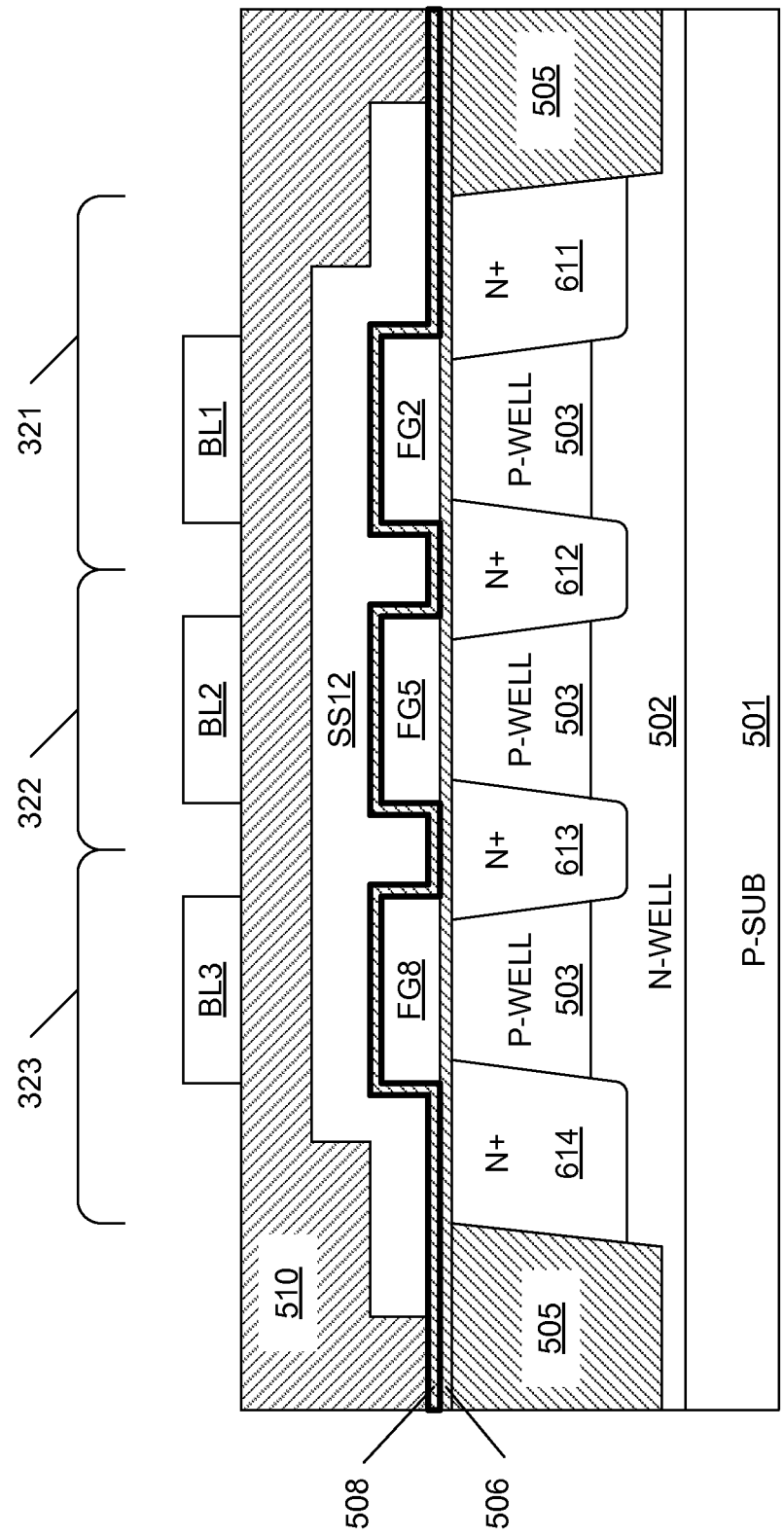
FIG. 5B is a cross-sectional view of three source access transistors along section line B-B of FIG. 4.

FIG. 5A is a cross-sectional view of EEPROM cell pair 315 along section line A-A of FIG. 4. FIG. 5B is a cross-sectional view of source access transistors 321-323 along section line B-B of FIG. 4.

As shown in FIGS. 5A and 5B, EEPROM array 300 is fabricated in p-well region 503. P-well region 503, in turn, is fabricated in deep N-well region 502. Deep N-well region 502 is fabricated in p-type substrate 501. FIG. 5B further illustrates shallow trench isolation regions 505, which isolate EEPROM array 300 from other circuits fabricated on the same substrate 501.

Turning now to FIG. 5A, memory transistor 301 includes n-type drain region 621, n-type source region 622, tunnel gate dielectric layer 506, floating gate FG1, inter-gate dielectric layer 507 and word line (control gate) WL1. Similarly, memory transistor 304 includes n-type drain region 624, n-type source region 623, tunnel gate dielectric layer 506, floating gate FG3, inter-gate dielectric layer 509 and word line (control gate) WL2. Contacts C1 and C2 extend through pre-metal dielectric layer 510 and contact n-type drain regions 621 and 624. Bit line BL1 is formed over pre-metal dielectric layer 510, and provides a conductive path between contacts C1 and C2.

Source access transistor 321 includes tunnel gate dielectric layer 506, floating gate FG2, inter-gate dielectric layer 508 and source select line SS12. Source access transistor 321 also shares n-type source regions 622 and 623 with memory transistors 301 and 304, respectively. In the described embodiments, inter-gate dielectric layers 507-509 are oxide-nitride-oxide (ONO) structures, although other dielectric materials can be used in other embodiments.

As illustrated in FIG. 5B, source access transistor 321 also includes N+ type finger regions 611-612, which are aligned with floating gate FG2, and extend down through p-well region 503 to contact n-well region 502. Similarly, source access transistors 322 includes N+ type finger regions 612-613, which are aligned with floating gate FG5; and source access transistor 323 includes N+ finger regions 613-614, which are aligned with floating gate FG8. P-well region 503 is connected to metal contacts (not shown) in a few locations of array 300, to preserve memory area.

FIGS. 6A-6G are top views of memory transistors 301-306 and source access transistors 321-323 during various stages of fabrication, in accordance with one embodiment of the present invention.

Figure 6A:
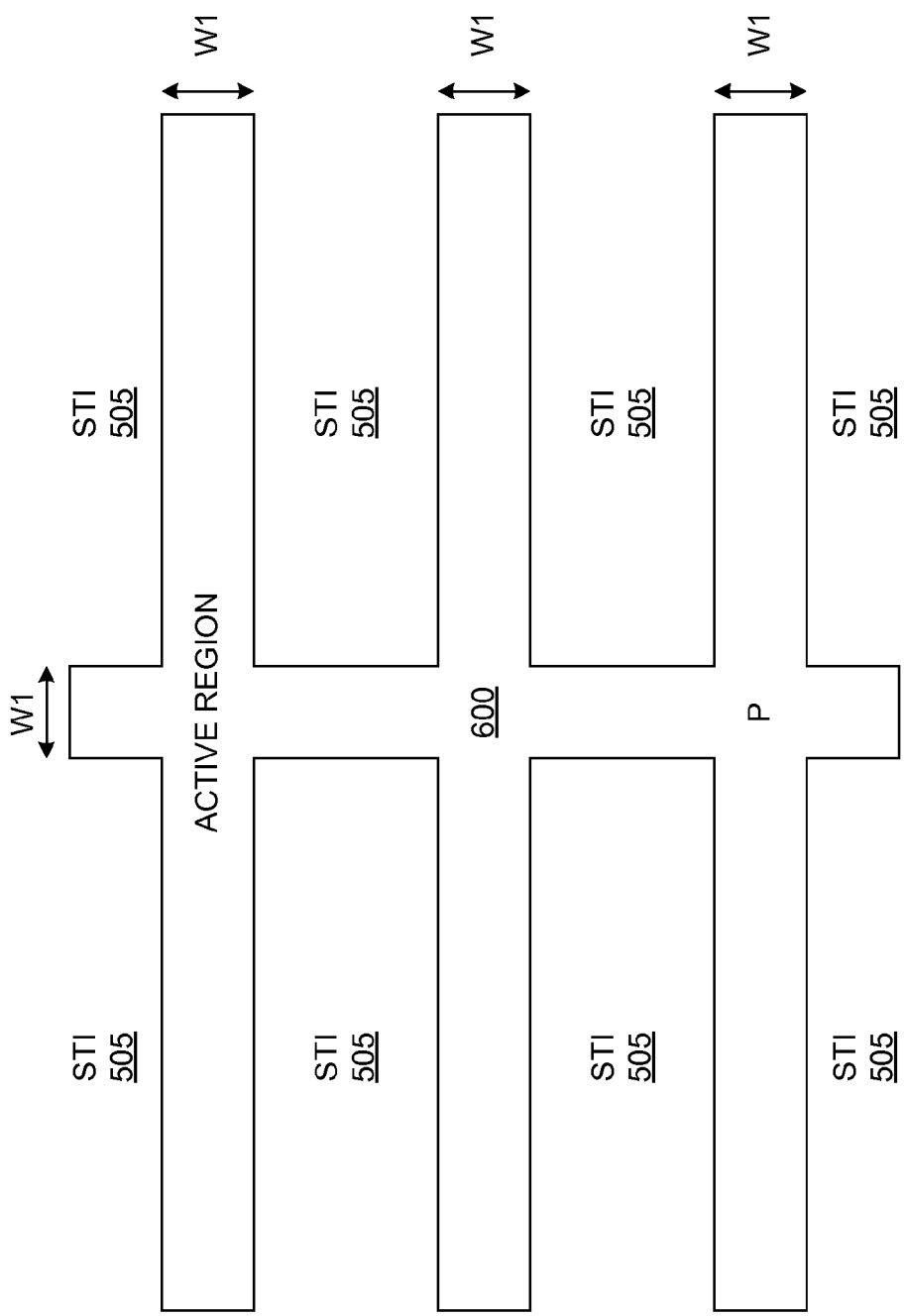

As illustrated in FIG. 6A, shallow trench isolation (STI) region 505 is formed on the upper surface of substrate 501, thereby defining the active region 600 where transistors 301-306 and 321-323 will be formed. At this time, deep n-well region 502 has already been formed. P-well region 503 can be formed either before or after STI region 505 is formed. In accordance with the described embodiment, transistors 301-306 and 321-323 are fabricated using a 0.25 micron process. In this embodiment, active region 600 exhibits a dimension W1 of 0.25 microns. Note that array 300 can be fabricated using other processes and other dimensions in other embodiments. Also note that the active region associated with the second two rows of array 300, if illustrated, would be continuous with active region 600.

Figure 6B:
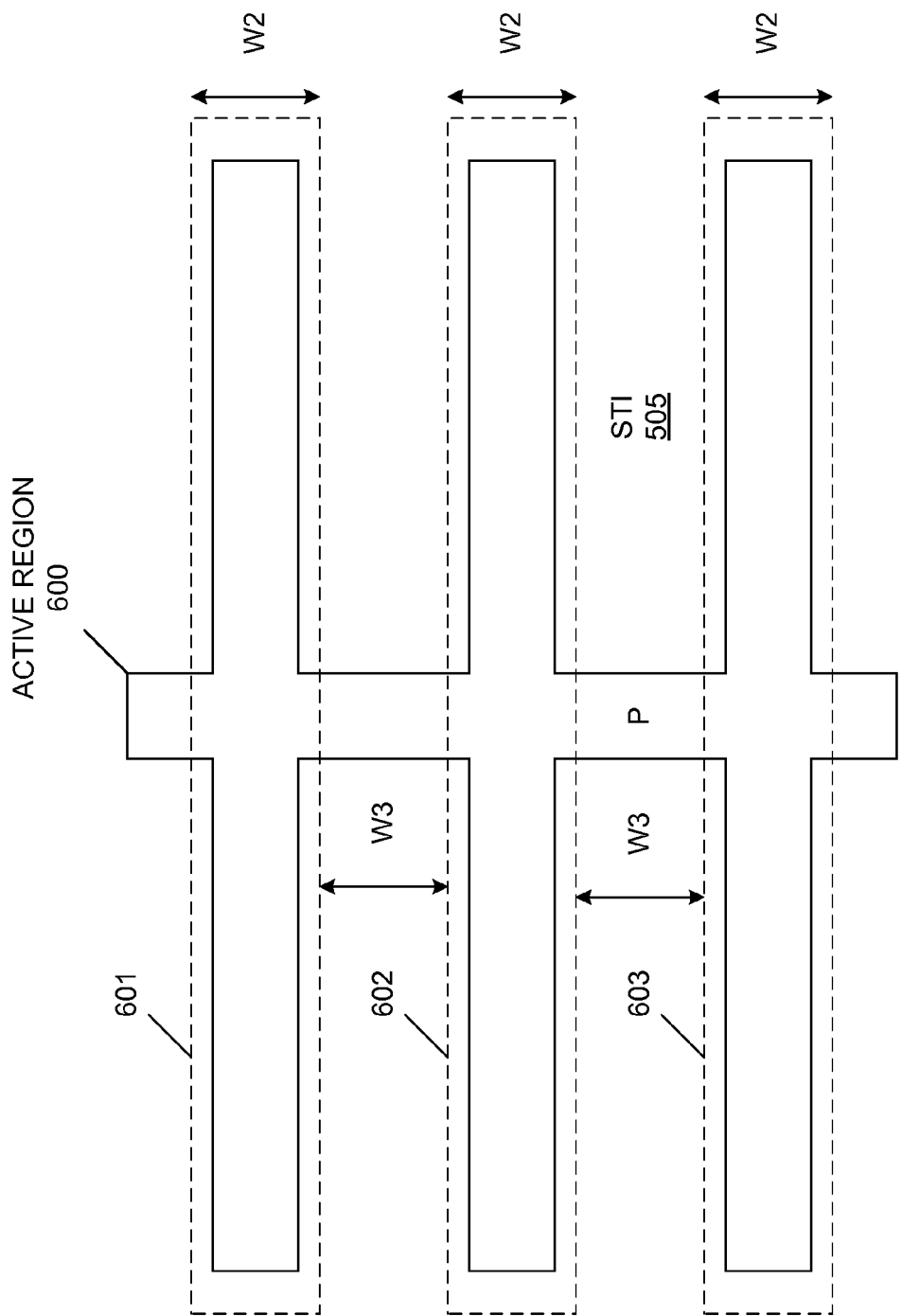

After active region 600 has been defined, tunnel gate dielectric layer 506 is formed over the exposed surface of p-well region 503. For example, tunnel gate dielectric layer 506 may have a thickness between about 70 Angstroms (A) and 100A. A first layer of polysilicon is formed over the resulting structure. This polysilicon layer is then patterned through a first polysilicon mask to form polysilicon gate electrodes 601-603, as shown in FIG. 6B. In the described embodiment, each of polysilicon gate electrodes 601-603 exhibits a width W2 of about 0.4 microns, and a spacing W3 of about 0.25 microns.

N+ implant is performed through the first polysilicon mask, thereby forming N+ finger regions 611-614 (and conductively doping polysilicon electrodes 601-603). The N+ implant is controlled such that N+ finger regions 611-614 contact the underlying deep n-well region 502. The resulting structure is illustrated in FIG. 6C.

Figure 6D:
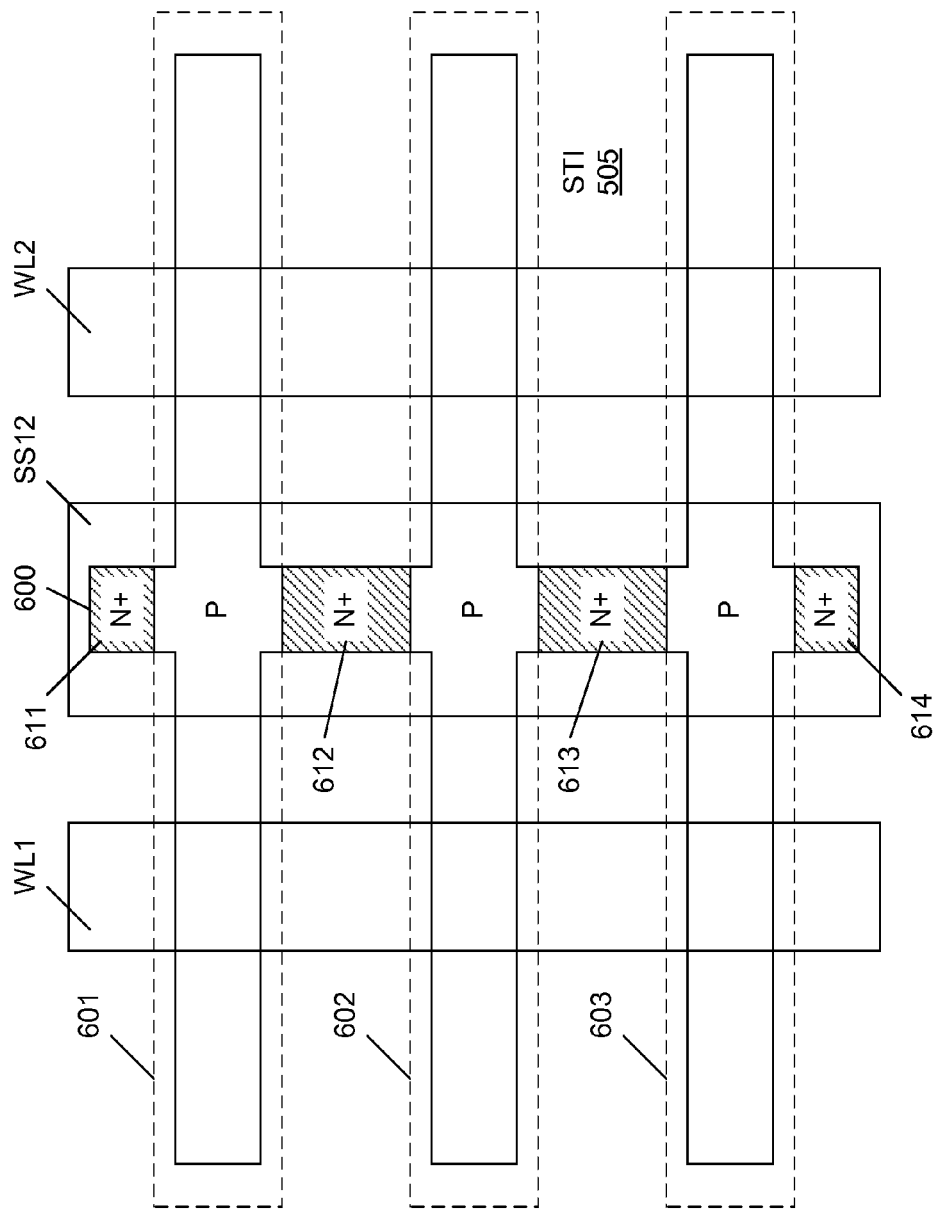

An inter-gate dielectric layer (not shown) is formed over the resulting structure. In the described embodiment, the inter-gate dielectric layer is an oxide-nitride-oxide (ONO) layer. A second polysilicon layer is then formed over the inter-gate dielectric layer. A second polysilicon mask, which defines word lines WL1 and WL2 and source select line SS12, is formed over the second polysilicon layer. The second polysilicon layer is then etched through the second polysilicon mask, thereby forming word lines WL1-WL2 and source select line SS12. This etch is continued through the inter-gate dielectric layer, thereby forming dielectric layers 507-509 (FIGS. 5A-5B). The resulting structure is illustrated in FIG. 6D.

Figure 6E:
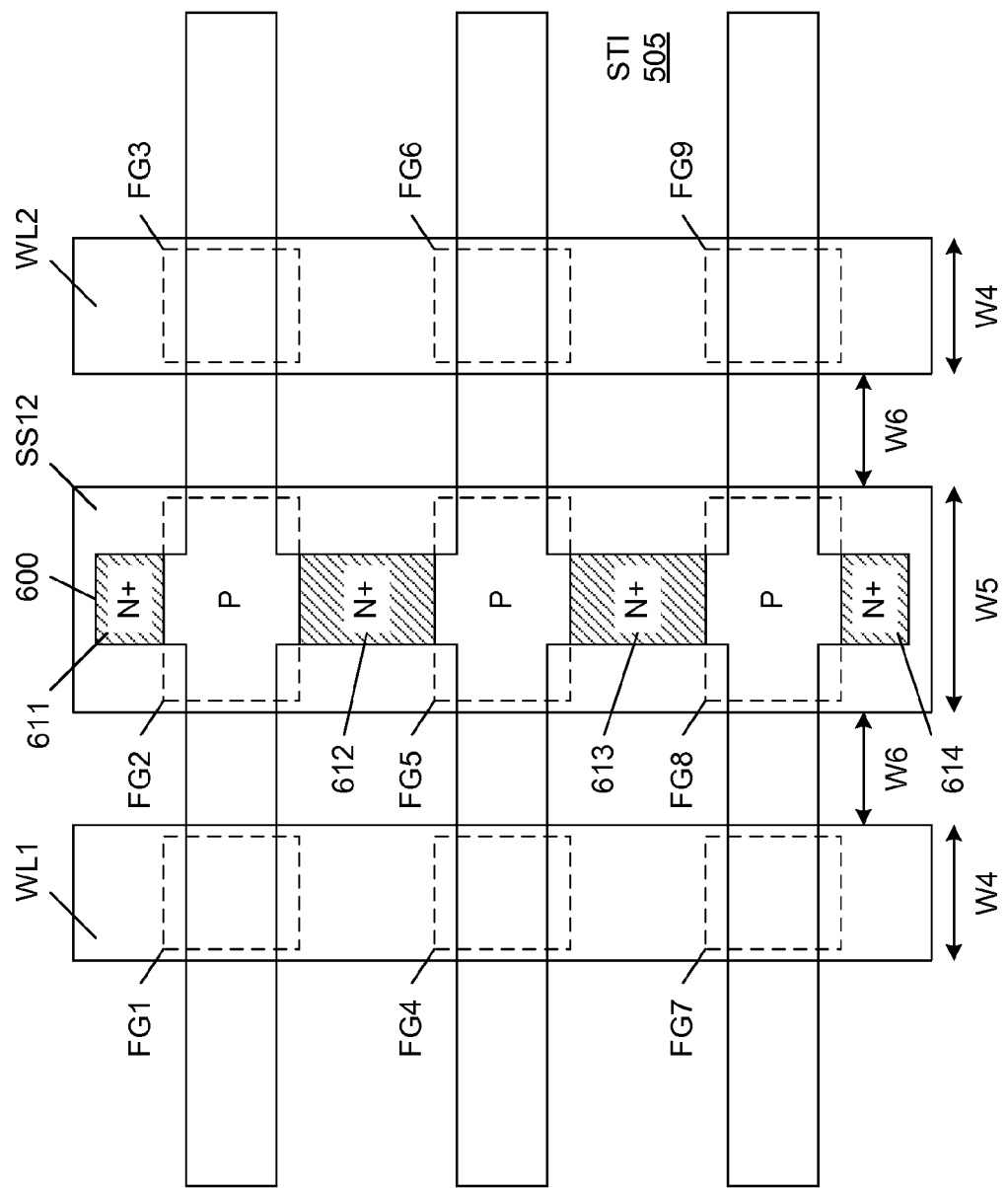

As illustrated in FIG. 6E, the etch is further continued through the exposed portions of polysilicon gate electrodes 601-603, thereby forming floating gates FG1-FG9. In the described embodiment, word lines WL1-WL2 exhibit a width W4 of about 0.25 microns, and source select line SS12 exhibits a width W5 of about 0.4 microns. The spacing W6 between word lines WL1-WL2 and source select line SS12 is about 0.25 microns in the described embodiment.

Figure 6F:
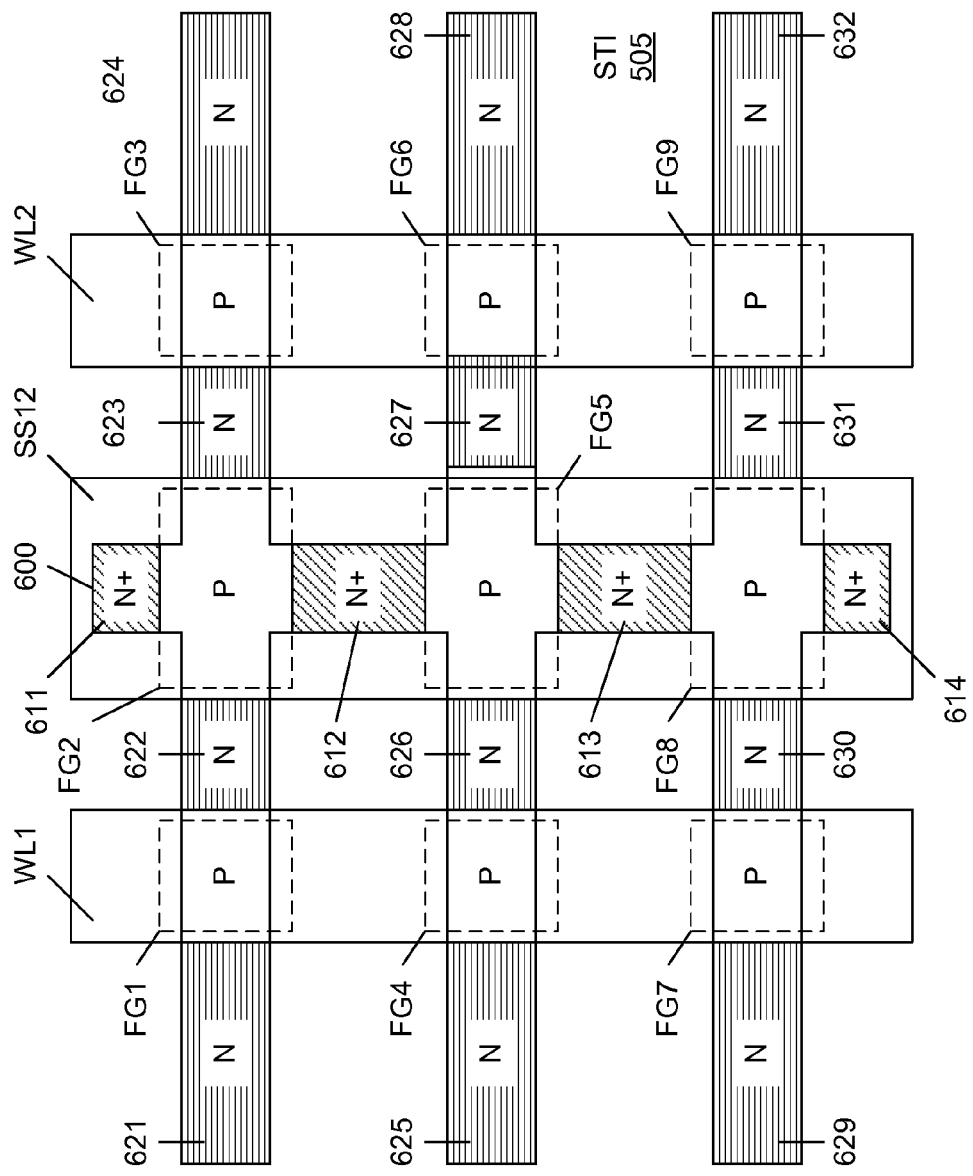

After the second polysilicon mask is removed, an n-type source/drain photoresist mask (not shown) is formed over the resulting structure, and an n-type source/drain implant is performed, thereby creating n-type source/drain regions 621-632 (and conductively doping polysilicon word lines WL1-WL2 and source select line SS12) as illustrated in FIG. 6F. The n-type source/drain mask is subsequently removed.

Figure 6G:
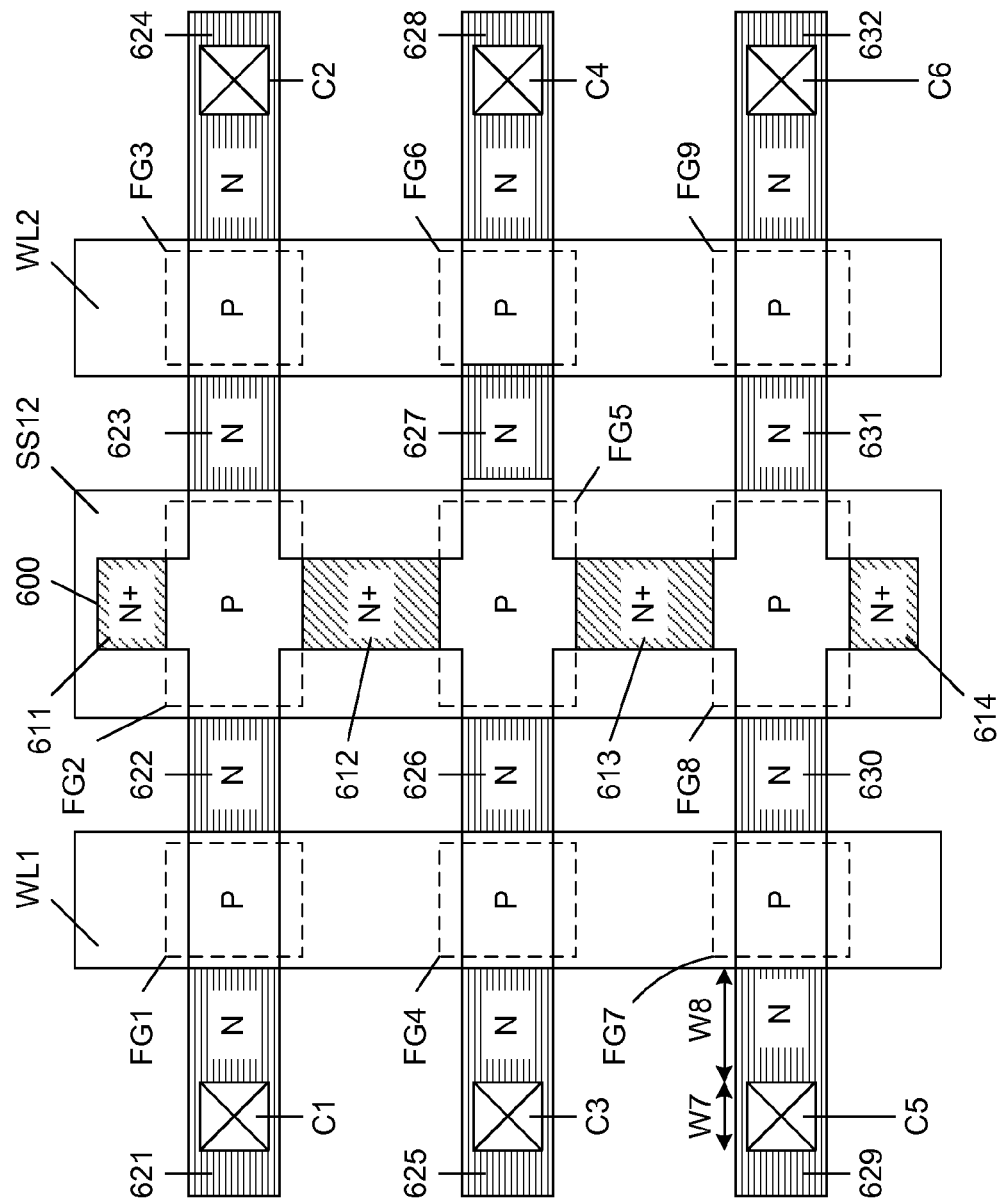

A pre-metal dielectric layer 510 is formed over the resulting structure, and contact openings are formed through this dielectric layer. Contacts C1-C6 are then formed in these contact openings, as illustrated in FIG. 6G. In the described embodiment, each of contacts C1-C6 has a width W7 of about 0.25 microns. Each of contacts C1-C6 is separated from the adjacent word line WL1 or WL2 by a distance W8 of about 0.25 microns. Bit lines BL1-BL3 are then formed, such that bit line BL1 connects contacts C1 and C2; bit line BL2 connects contacts C3 and C4; and bit line BL3 connects contacts C5 and C6. In the described embodiment, each EEPROM cell has a length of about 1.07 microns, a width of about 0.65 microns, and an area of about 0.696 microns$^2$. In the above-described manner, EEPROM array 300 can advantageously be fabricated using a conventional EEPROM process.

The operation of EEPROM array 300 will now be described. Erase operations are performed on a per row basis. For example, to erase the first row of memory transistors 301-303, the control gates of these transistors are grounded by grounding word line WL1. A programming voltage $V_{PP}$ (e.g., 15 Volts) is applied to deep n-well region 502 and p-well region 503 (p-substrate 501 is grounded). The bit lines BL1-BL3 are left floating and source select lines SS12 and SS34 are tied to the programming voltage $V_{PP}$. Under these conditions, a tunneling current flows from p-well region 503 to the floating gates (FG1, FG4 and FG7) of memory transistors 301, 302 and 303. As a result, electrons are removed from the floating gates of memory transistors 301-303, thereby erasing these memory transistors.

Other rows of EEPROM array 300 can be erased at the same time by grounding the corresponding word line. For example, grounding word line WL3 would cause the third row of memory transistors 307-309 to be erased at the same time as the first row of memory transistors 301-303.

The programming voltage $V_{PP}$ is applied to the control gates of memory transistors that are not to be erased. For example, applying the programming voltage $V_{PP}$ to word lines WL2-WL4 will apply the programming voltage $V_{PP}$ to the control gates of memory transistors 304-312, thereby preventing these memory transistors from being erased.

Programming operations will now be described. To program memory transistor 301, the programming voltage $V_{PP}$ is applied the corresponding word line WL1, and the corresponding bit line BL1 is grounded. Deep n-well region 502, p-well region 503 and source select line SS12 are also grounded. Under these conditions, a tunnel current flows from the floating gate FG1 of memory transistor 301 to p-well region 503. As a result, electrons are injected into the floating gate FG1 of memory transistor 301, thereby programming this memory transistor.

Applying an intermediate voltage $V_{INT}$ (e.g., 3 . . . 5 Volts) to bit lines BL2-BL3 prevents memory transistors 302 and 303 from being programmed at the same time as memory transistor 301. More specifically, the intermediate voltage VINT inhibits tunneling current in these memory transistors 302-303. Memory transistor 302 and/or memory transistor 303 can be programmed at the same time as memory transistor 301 by grounding the corresponding bit line(s). For example, memory transistor 303 can be programmed at the same time as memory transistor 301 by grounding the corresponding bit line BL3 (in combination with the above-described conditions for programming memory transistor 301). Thus, programming can be performed on a per bit manner within a single row.

Moreover, grounding word lines WL2-WL4 prevents memory transistors 304, 307 and 310 from being programmed at the same time as memory transistor 301. More specifically, grounding word lines WL2-WL4 inhibits tunneling current in these memory transistors 304, 307 and 310. Memory transistors 304, 307 and/or 310 can be programmed at the same time as memory transistor 301 by applying the programming voltage $V_{PP}$ to the corresponding word line(s). For example, memory transistor 307 can be programmed at the same time as memory transistor 301 by applying the programming voltage $V_{PP}$ to the corresponding word line WL3 (in combination with the above-described conditions for programming memory transistor 301). Thus, programming can be performed on a per bit manner within a single column. Note that all bits located at an intersection of a selected row and a selected column will have the same programmed state. This is useful for writing test patterns in block mode.

Advantageously, the high programming voltage $V_{PP}$ is not applied to the drain junctions of memory transistors 301-312 during erase and program operations. Furthermore, the high programming voltage $V_{PP}$ is not applied across bit lines BL1-BL3 and p-well region 503 or n-well region 502. Moreover, the high programming voltage $V_{PP}$ is not applied across source select lines SS12-SS34 and p-well region 503 or n-well region 504. Consequently, the source access transistors 321-326 and memory transistors 301-313 may be scaled to sub-0.35 micron processes.

Read operations are performed on a per row basis. For example, the first row of memory transistors 301-303 are read as follows. A first read voltage $V_{R1}$ of about 0.5 to 1.5 Volts, depending on the sense amplifier design, is applied to each of bit lines BL1-BL3, and the $V_{DD}$ supply voltage (about 2.5 Volts) is applied to the corresponding word line WL1 and the corresponding source select line SS12. Non-selected word lines WL2-WL4 and corresponding source select line SS34 are grounded. P-well region 503 is grounded and deep n-well region 502 is held at a second read voltage $V_{R2}$ of about 0.5 to 1.0 Volts. Under these conditions, significant read current will flow through erased memory transistors in the first row, while no significant read current will flow through programmed memory transistors in the first row or through erased cells of the deselected second row. Sense amplifiers coupled to bit lines BL1-BL3 identify the read currents flowing through memory transistors 301-303 (and therefore the logic states of the bits stored by these memory transistors). Note that the read current associated with memory transistor 301 will flow along a path that includes: deep n-well 502, n+ regions 611-612, source region 622 and drain region 621. In this manner, deep n-well region 502 provides a common source region for all of the EEPROM cells in array 300.

FIG. 7 is a table 700 that summarizes various erase, program and read operations of EEPROM array 300.

Under the operating conditions described above, source access transistors 321-326 are never biased such that tunneling current will flow into or out of the floating gates associated with these select access transistors. For example, floating gates FG2, FG5 and FG8 associated with source access transistors 321-323 (see, FIGS. 5B and 6G) are never subject to program or erase conditions. Thus, source access transistors 321-326 are operated as conventional (non-memory) transistors, even though each of these transistors has the basic structure of a non-volatile memory transistor. In the above described embodiments, source access transistors 321-326 are fabricated in a manner that simplifies the process required to fabricate EEPROM array 300.

Figure 8A:
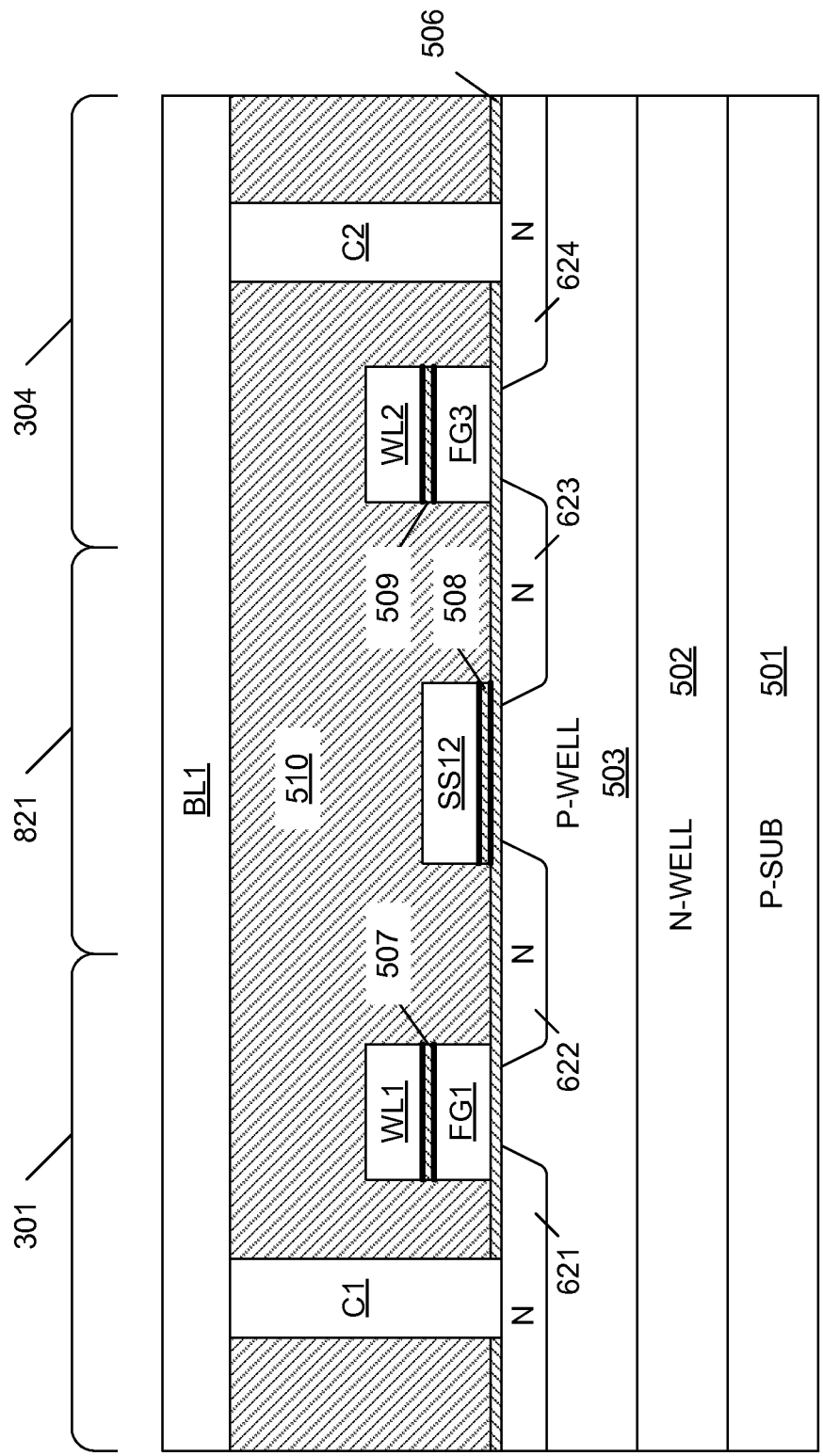
FIGS. 8A and 8B are cross sectional views illustrating source select transistors fabricated in accordance with an alternate embodiment of the present invention.
Figure 8B:
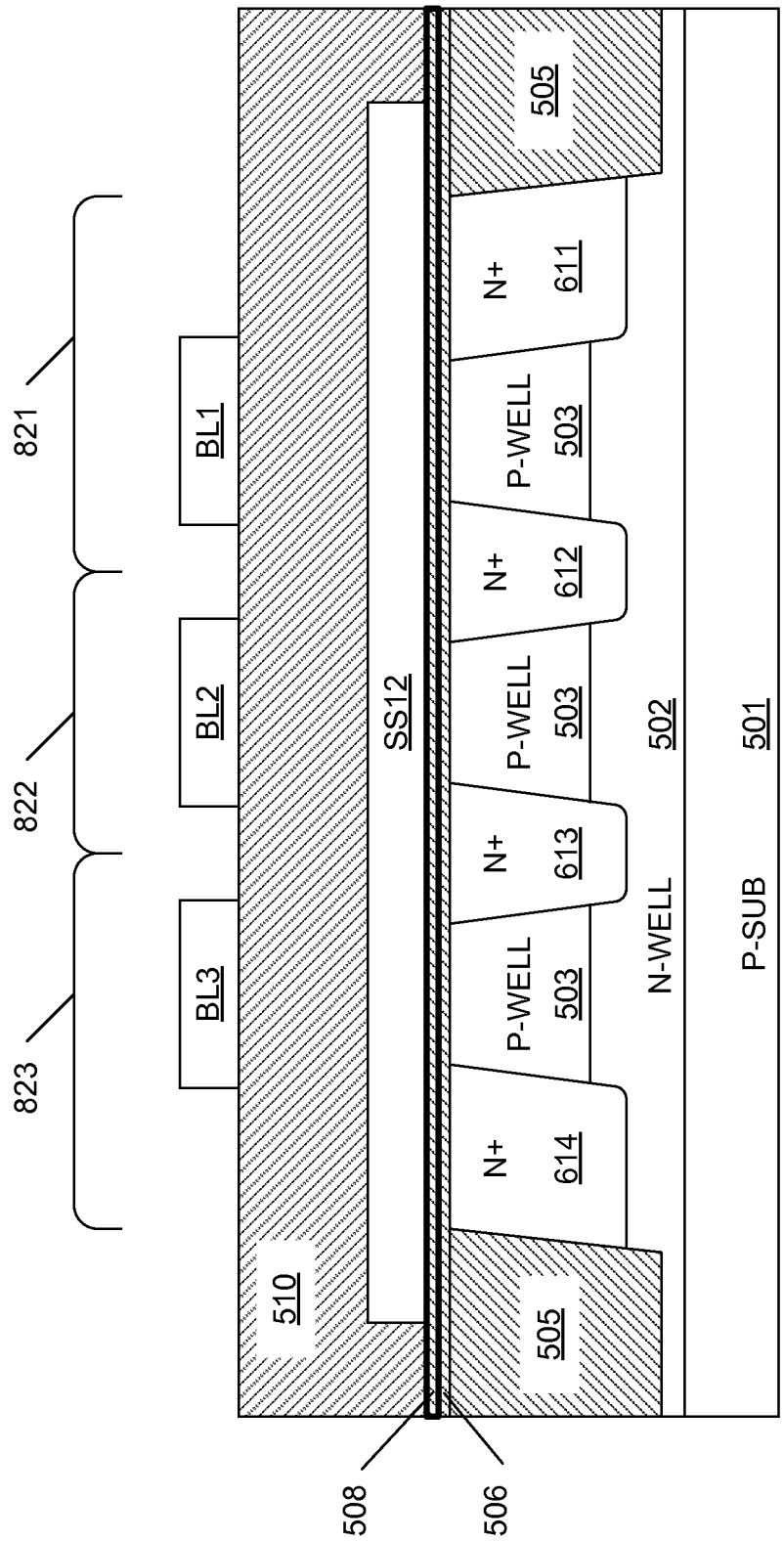

However, in an alternate embodiment, source access transistors 321-326 can be fabricated in different manners. For example, after the N+ regions 611-614 are formed (see, FIG. 6C), polysilicon electrodes 601-603 can be patterned and etched to remove the portions of these electrodes that eventually become floating gates FG2, FG5 and FG8. Processing then continues in the manner described above in FIGS. 6D-6G. FIGS. 8A and 8B are cross sectional views of the resulting source access transistors 821-823, along the same section lines as FIGS. 5A and 5B, respectively. The source access transistors 831-833 of this embodiment will exhibit better performance (because the floating gates FG2, FG5 and FG8 have been eliminated), at the expense of a slightly more complicated process. In alternate embodiments, the process can be further modified such that the gate dielectric of source access transistors 831-833 include only gate dielectric layer 506 or only ONO structure 508 (but not both). In yet another embodiment, the process is further modified so that source access transistors 831-833 include a custom gate dielectric.

In yet another embodiment, the floating gates FG2, FG5 and FG8 are replaced with a continuous floating gate, which is electrically shorted to the overlying source select line SS12. This embodiment will now be described in more detail.

Figure 9:
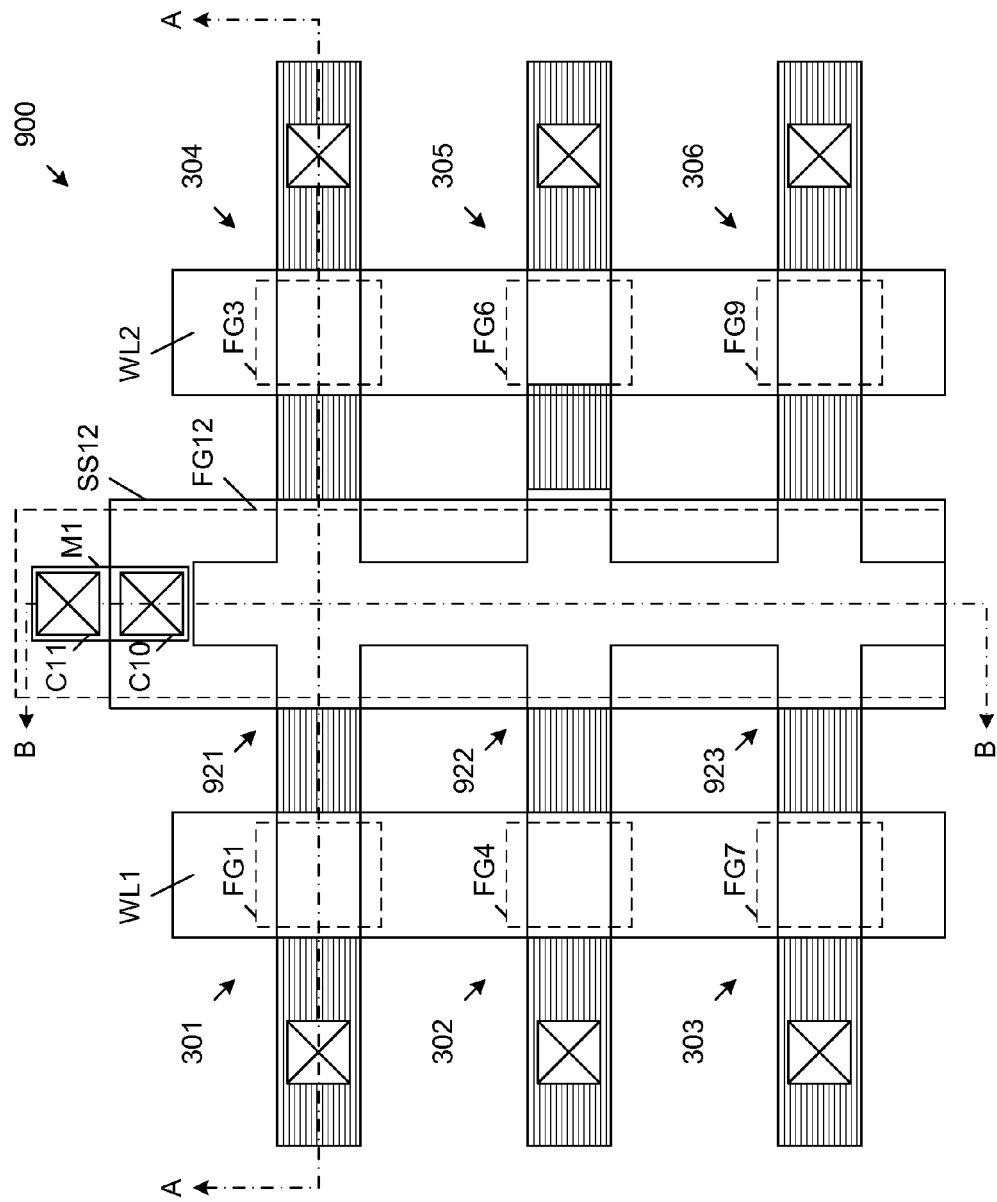
FIG. 9 is a top layout view of the first two rows of an array 900 in accordance with the presently described alternate embodiment of the invention.

FIG. 9 is a top layout view of the first two rows of an array 900 in accordance with the presently described alternate embodiment of the invention. Because the array 900 of FIG. 9 is similar to the array of FIG. 4, similar elements FIGS. 4 and 9 are labeled with similar reference numbers. Thus, the array of FIG. 9 includes memory transistors 301-306, word lines WL1-WL2 and source select line SS12, which have been described above in connection with FIG. 4. In addition, the array of FIG. 9 includes source access transistors 921-923, which replace the source access transistors 321-323 of the array of FIG. 4. Source access transistors 921-923 share a common floating gate FG12 (in contrast with source access transistors 321, 322 and 323, each of which has a discrete corresponding floating gate FG2, FG5 and FG8, respectively). The common floating gate FG12 is connected to the source select line SS12 by metal contacts C10-C11 and metal trace M1. The source access transistors 921-923 of the array of FIG. 9 do not include N+ finger regions which contact the underlying N-well region (unlike source access transistors 321-323 of the array of FIG. 4, which include N+ finger regions 611-614). The significance of these differences between the array of FIG. 9 and the array of FIG. 4 will become apparent in view of the following description.

Figure 10A:
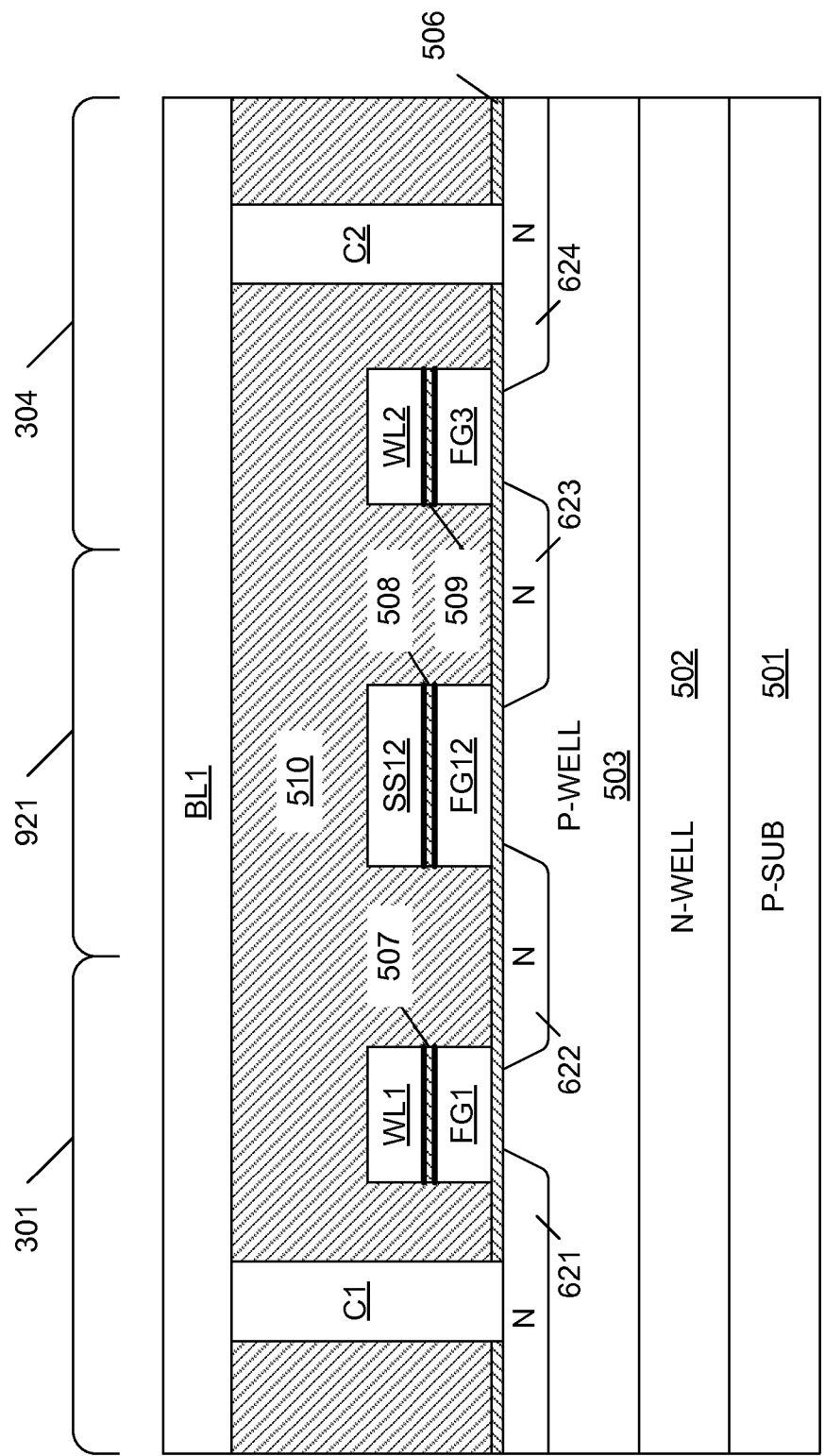
FIG. 10A is a cross-sectional view of an EEPROM cell pair along section line A-A of FIG. 9.
Figure 10B:
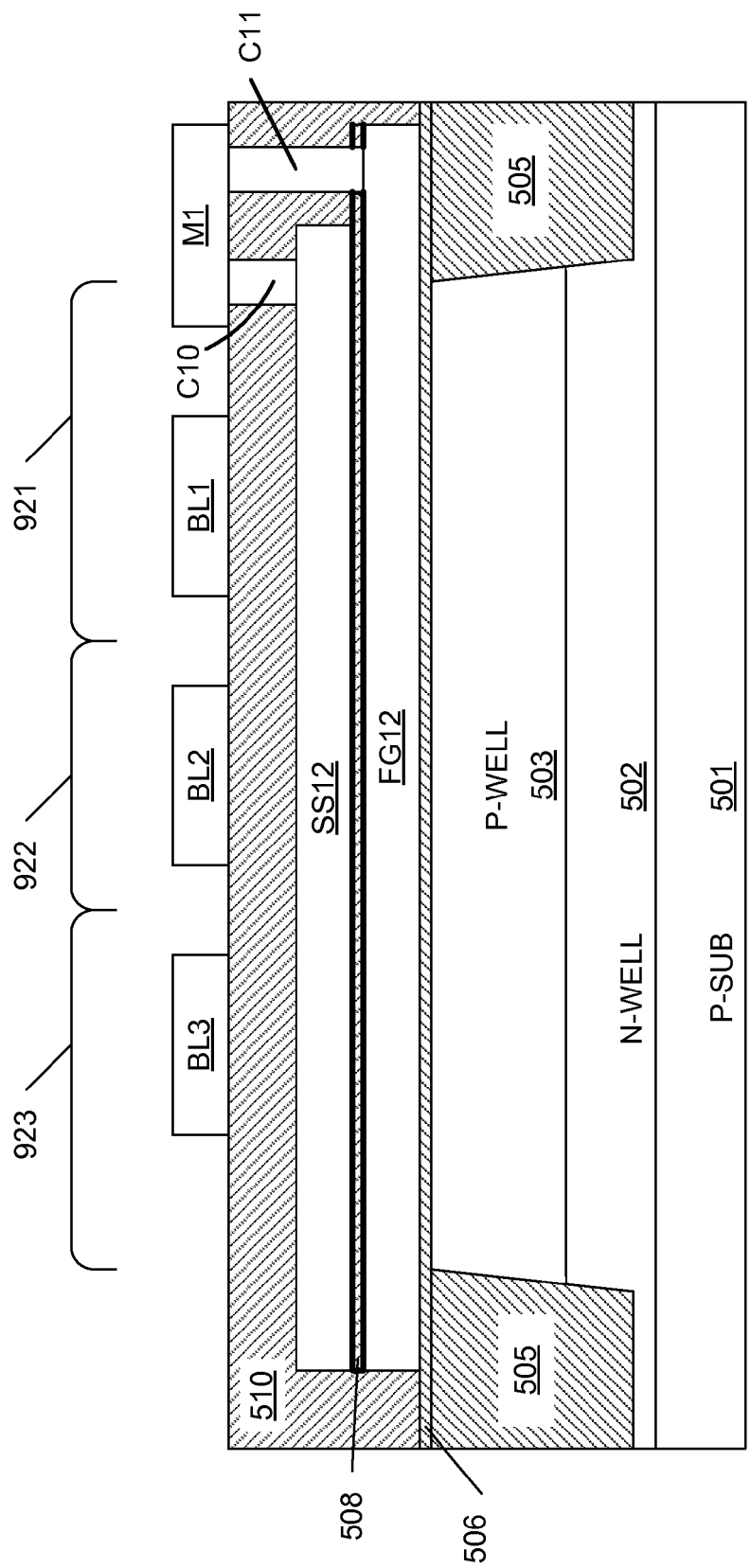
FIG. 10B is a cross-sectional view of three source access transistors along section line B-B of FIG. 9.

FIG. 10A is a cross-sectional view of EEPROM cells 301 and 304 and source access transistor 921, along section line A-A of FIG. 9. FIG. 10B is a cross-sectional view of source access transistors 921-923 along section line B-B of FIG. 9.

As shown in FIGS. 10A and 10B, EEPROM array 900 includes p-type substrate 501, deep N-well region 502, p-well region 503, shallow trench isolation regions 505, tunnel gate dielectric layer 506, inter-gate dielectric layers 507-509, pre-metal dielectric layer 510, n-type source/drain regions 621-624, floating gates FG1 and FG3, word lines (control gates) WL1-WL2, contacts C1 and C2, and bit lines BL1-BL3, which have been described above in connection with FIGS. 5A and 5B.

In addition, source access transistors 921-923 include a continuous floating gate FG12 located over tunnel gate dielectric layer 506. The inter-gate dielectric layer 508 is located between the continuous floating gate FG12 and the overlying source select line SS12. A contacts C10 and C11 extends through the pre-metal dielectric layer 510 (and the inter-gate dielectric layer 508 in the case of contact C11) to electrically contact source select line SS12 and floating gate FG12, respectively. Metal trace M1 electrically connects contacts C10 and C11, such that floating gate FG12 is electrically connected to source select line SS12. In the illustrated embodiment, contacts C10-C11 and metal trace M1 are formed at an edge of the array. In another embodiment, another contract structure, similar to the contact structure formed by contacts C10-C11 and metal trace M1, can be provided at an opposite edge of the array. Applying source select control voltage to metal trace M1 advantageously causes this control voltage to be applied to both the floating gate FG12 and the source select line SS12. Because the floating gate FG12 is only separated form the underlying p-well region 503 by the tunnel gate dielectric layer 506, improved gate voltage coupling is provided for the source select transistors 921-923, thereby improving the performance of these source select transistors.

As will become apparent in view of the following description, fabrication of the continuous floating gate FG12 effectively prevents the formation N+ finger regions, such as N+ finger regions 611-614 illustrated in FIG. 5B.

FIGS. 11A-11E are top views of memory transistors 301-306 and source access transistors 921-923 during various stages of fabrication, in accordance with one embodiment of the present invention.

Figure 11A:
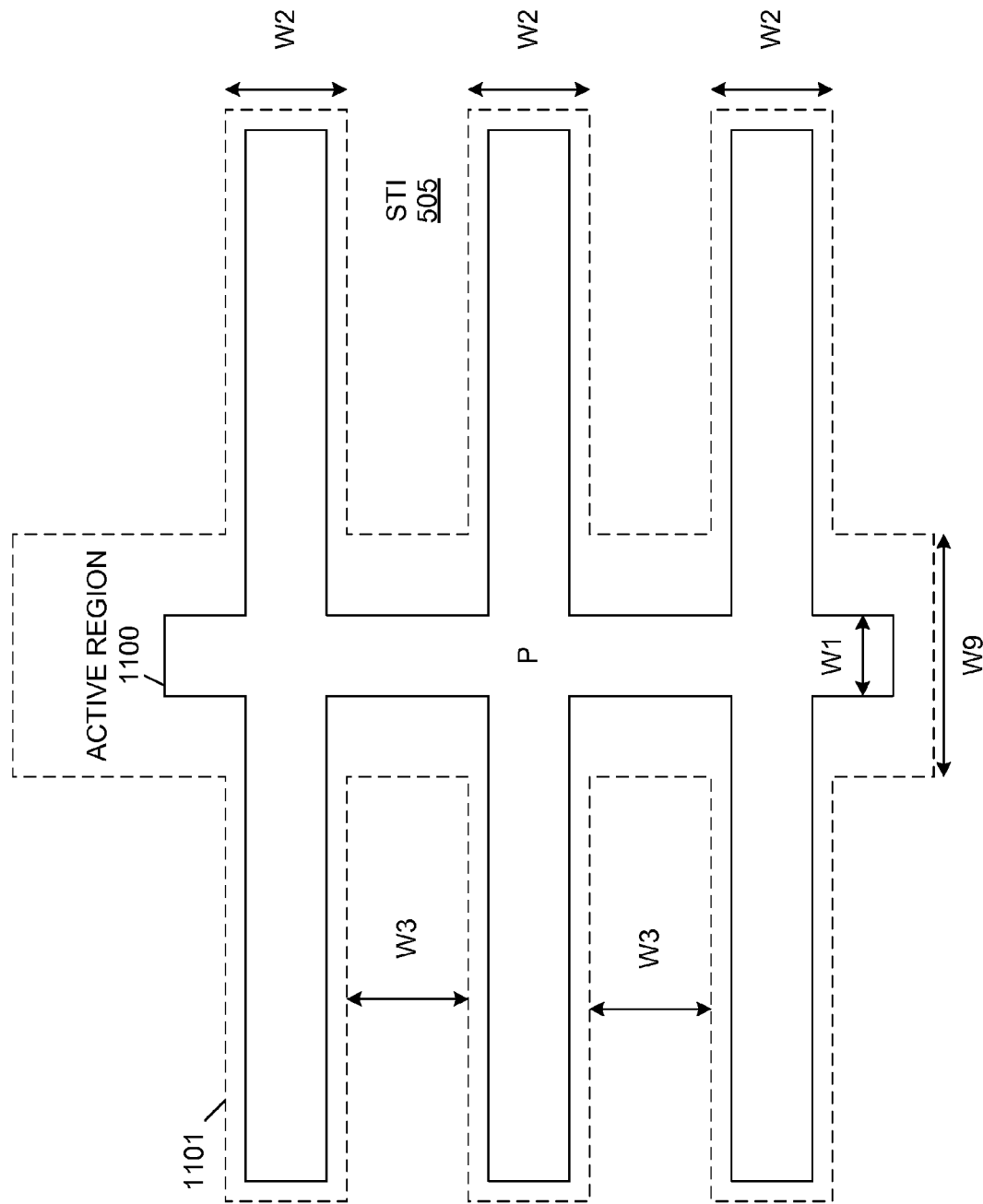

As illustrated in FIG. 11A, shallow trench isolation (STI) region 505 is formed on the upper surface of substrate 501, thereby defining the active region 1100 where transistors 301-306 and 921-923 will be formed. At this time, deep n-well region 502 has already been formed. P-well region 503 can be formed either before or after STI region 505 is formed. In accordance with the described embodiment, transistors 301-306 and 921-923 are fabricated using a 0.25 micron process. In this embodiment, active region 1100 exhibits a dimension W1 of 0.25 microns. Note that array 300 can be fabricated using other processes and other dimensions in other embodiments. Also note that the active region associated with additional rows of the array would be continuous with active region 1100.

After active region 1100 has been defined, tunnel gate dielectric layer 506 is formed over the exposed surface of p-well region 503 in the manner described above in connection with FIG. 6A. A first layer of polysilicon is formed over the resulting structure. This polysilicon layer is then patterned through a first polysilicon mask to form patterned polysilicon structure 1101. The patterned polysilicon structure 1101 exhibits widths W2 of about 0.4 microns, spacings W3 of about 0.25 microns, and a width W9 of about 0.5 microns.

An inter-gate dielectric layer (not shown) is formed over the resulting structure. In the described embodiment, the inter-gate dielectric layer is an oxide-nitride-oxide (ONO) layer. A second polysilicon layer is then formed over the inter-gate dielectric layer. A second polysilicon mask, which defines word lines WL1 and WL2 and source select line SS12, is formed over the second polysilicon layer. The second polysilicon layer is then etched through the second polysilicon mask, thereby forming word lines WL1-WL2 and source select line SS12. This etch is continued through the inter-gate dielectric layer, thereby forming inter-gate dielectric layers 507-509 (FIGS. 10A-10B). The resulting structure is illustrated in FIG. 11B.

As illustrated in FIG. 11C, the etch is further continued through the exposed portions of patterned polysilicon structure 1101, thereby forming floating gates FG1, FG3-FG4, FG6-FG7, FG9 and FG12. The second polysilicon mask is then removed. In the described embodiment, word lines WL1-WL2 exhibit a width W4 of about 0.25 microns, and source select line SS12 exhibits a width W5 of about 0.4 microns. The spacing W6 between word lines WL1-WL2 and source select line SS12 is about 0.25 microns in the described embodiment.

Figure 11D:
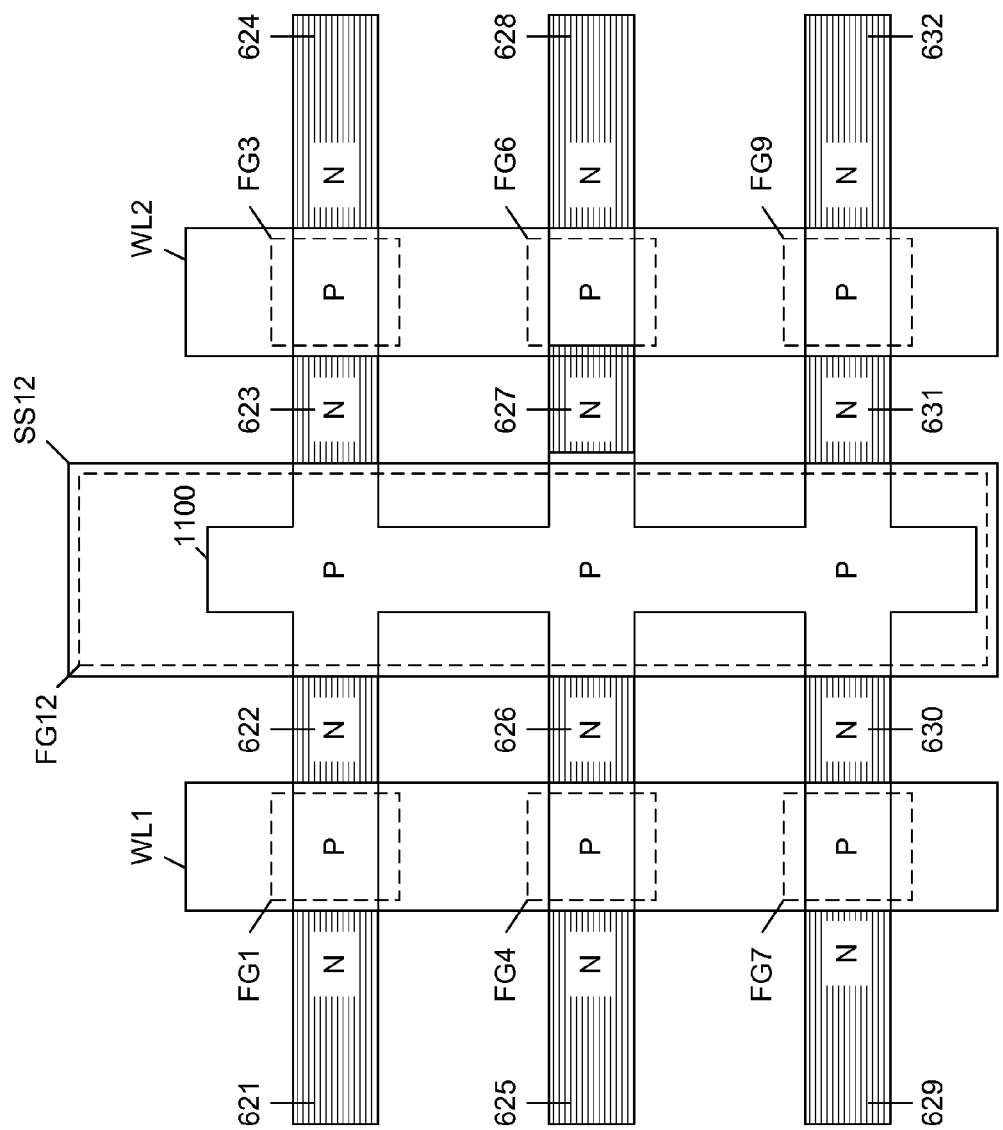

After the second polysilicon mask is removed, an n-type source/drain photoresist mask (not shown) is formed over the resulting structure, and an n-type source/drain implant is performed, thereby creating n-type source/drain regions 621-632 (and conductively doping polysilicon word lines WL1-WL2 and source select line SS12) as illustrated in FIG. 11D. The n-type source/drain mask is subsequently removed.

Figure 11E:
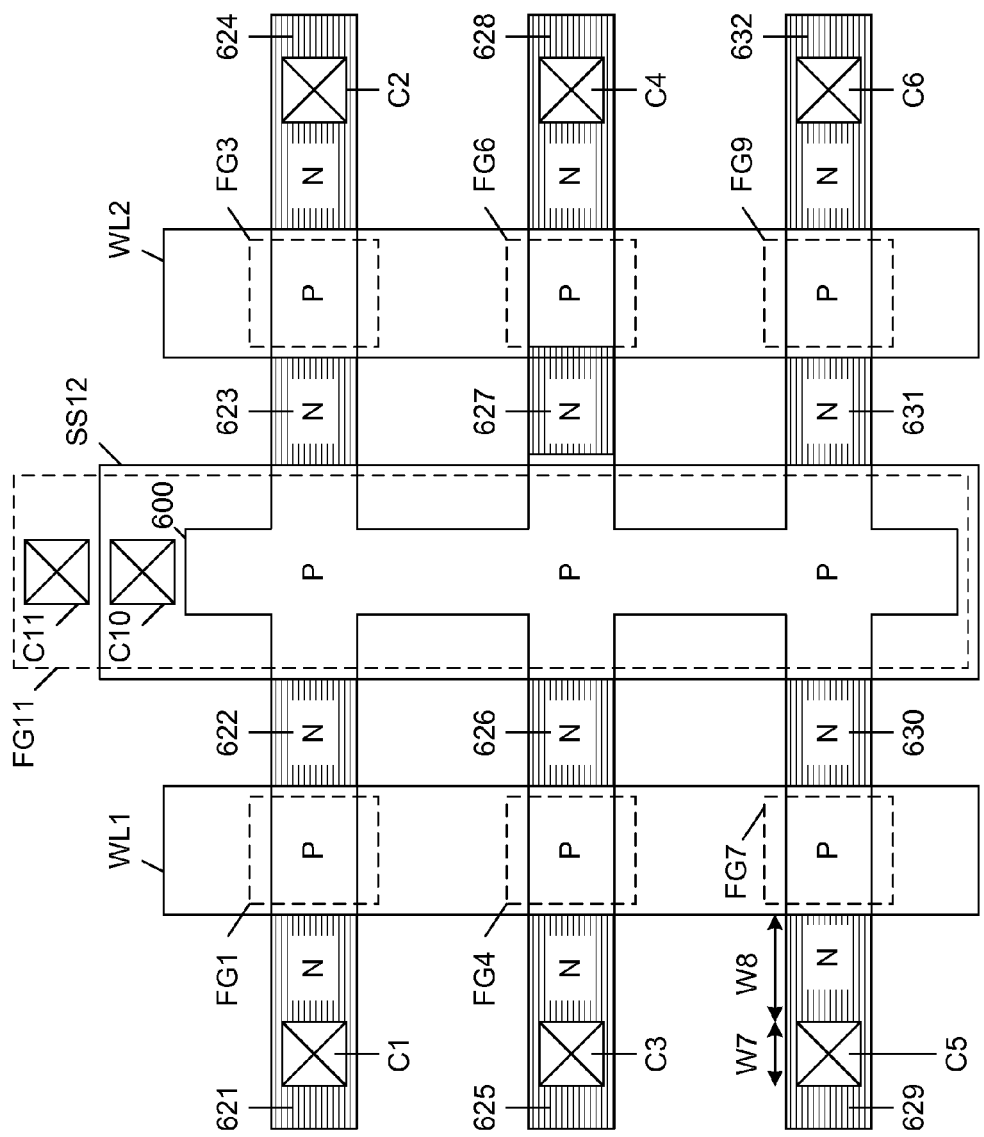

A third polysilicon mask is then formed over the resulting structure. The third polysilicon mask exposes the location where contact C11 is to be formed. That is, the third polysilicon mask exposes the portion of source select line SS12 that must be removed in order to expose the underlying floating gate electrode FG11. An etch is performed through the third polysilicon mask, thereby removing the exposed portion of the source select line SS12. This results of this etch are illustrated in FIG. 11E. The third polysilicon mask is then removed.

A pre-metal dielectric layer 510 is formed over the resulting structure, and contact openings are formed through this dielectric layer. Contacts C1-C6 and C10-C11 are then formed in these contact openings, as illustrated in FIG. 11E. In the described embodiment, each of contacts C1-C6 and C10-C11 has a width W7 of about 0.25 microns. Each of contacts C1-C6 is separated from the adjacent word line WL1 or WL2 by a distance W8 of about 0.25 microns. Bit lines BL1-BL3 and metal trace M1 are then formed, such that bit line BL1 connects contacts C1 and C2; bit line BL2 connects contacts C3 and C4; bit line BL3 connects contacts C5 and C6; and metal trace M1 connects contacts C10 and C11. In the described embodiment, each EEPROM cell has a length of about 1.07 microns, a width of about 0.65 microns, and an area of about 0.696 microns². Note that above dimensional numbers are provide one example, which is appropriate for a generic 0.18 micron process. A person skilled in the art would be capable of modifying these dimensional numbers for use with other processes.

Because the source select transistors 921-923 do not include N+ finger regions providing connections to the underlying deep N-well region 502, other circuitry must be provided to enable read current to be supplied to the rows of EEPROM transistors 301-306 during read operations. In accordance with one embodiment, at least one additional column is added to the array, wherein each additional column is configured to operate as a source supply circuit in the manner described below.

Figure 12:
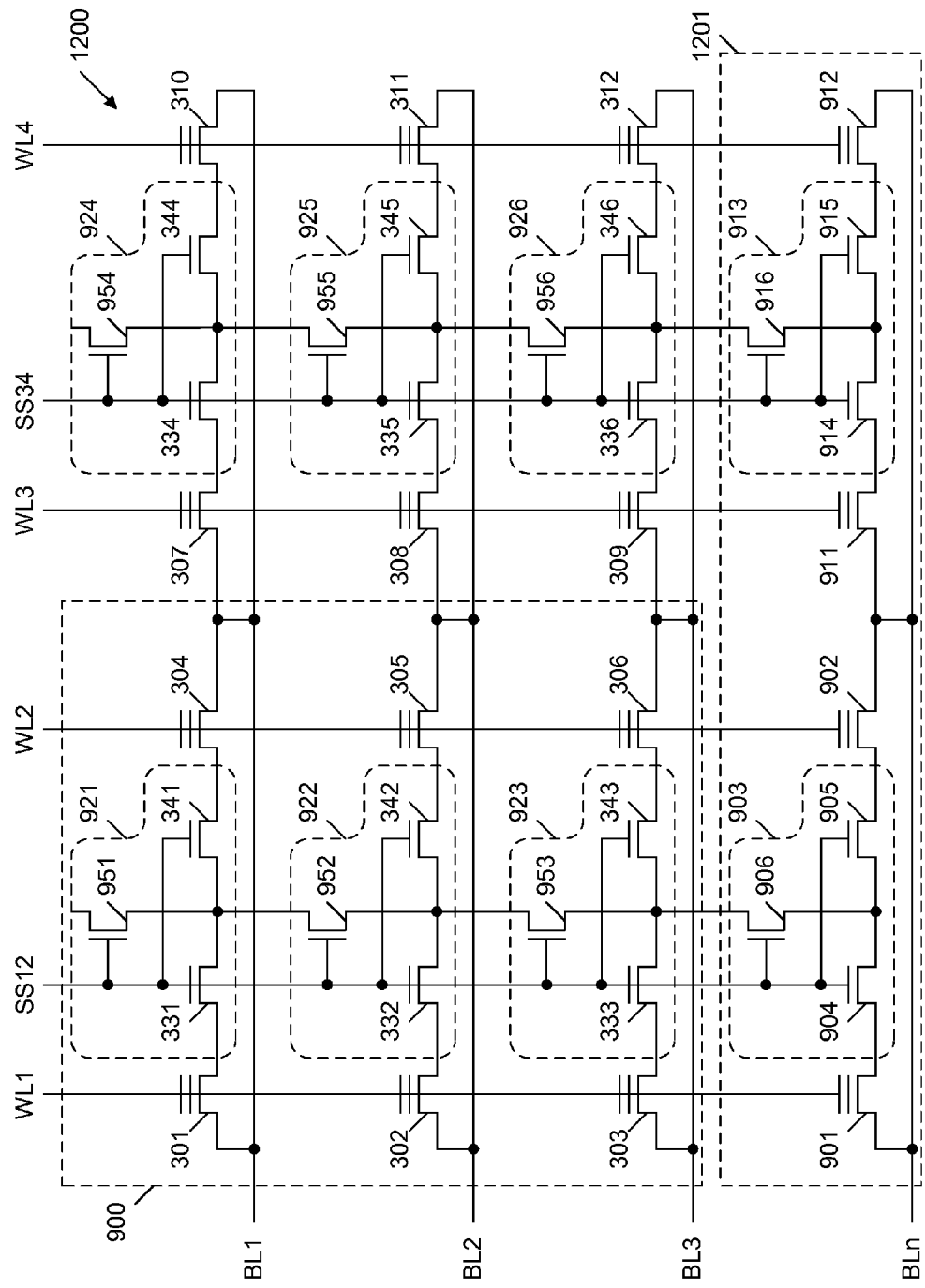
FIG. 12 is a circuit diagram of an EEPROM array in accordance with an alternate embodiment of the present invention, which includes the array structure of FIG. 9 and one additional column configured to operate as a source supply circuit.

FIG. 12 is a circuit diagram of an EEPROM array 1200 in accordance with the present embodiment, which includes one additional column 1201 configured to operate as a source supply circuit. This additional column 1201, which is identified by the corresponding bit line BLn, can be referred to as source access column 1201. EEPROM array 1200 includes the array 900, which is described above in connection with FIGS. 9, 10A-10B and 11A-11E. Array 900 is duplicated in array 1200, thereby providing floating gate non-volatile memory transistors 307-312, source access transistors 924-926, word lines WL3-WL4, and source select line SS34.

The source access column 1201 of array 1200 includes bit line BLn, non-volatile memory transistors 901-902 and 911-912, and source access transistors 903 and 913. The source access column 1201 is substantially identical to the other three columns, with differences noted below. Note that source access transistor 903 shares the same source select electrode SS12 and the same continuous floating gate electrode FG12 with source select transistors 921-923. Similarly, source access transistor 913 shares the same source select electrode SS34 and the same continuous floating gate electrode with source select transistors 924-926.

Source access transistors 921-926 include transistor structures 331-336, respectively, and transistor structures 341-346, respectively, which have been described above in connection with array 300 (FIG. 3, source access transistors 321-326). In addition, source access transistors 921-926 include transistor structures 951-956, respectively. Similarly, within the additional column, source access transistors 903 and 913 include transistors structures 904 and 914, respectively, transistor structures 905 and 915, respectively, and transistor structures 906 and 916, respectively. Transistor structures 951-953 and 906 couple the source access transistors 921-923 and 903. Similarly, transistor structures 954-956 and 916 couple the source access transistors 924-926 and 913.

In accordance with the present embodiment, non-volatile memory transistors 901-902 and 911-912 are always in a conductive state. This can be achieved, for example, by shorting the source/drain diffusion regions of these transistors, or by programming these transistors to always have a conductive state.

FIG. 13 is a table 1300 that summarizes erase, program and read operations of the EEPROM array of FIG. 12 in accordance with one embodiment of the present invention. Erase and program operations are performed in the same manner described above in connection with FIG. 7.

During a read access of a selected row, the $V_{DD}$ supply voltage is applied to the word line and the source select line associated with the selected row. For example, for a read access of the first row, the $V_{DD}$ supply voltage is applied to word line WL1 and to source select line SS12. During each read access, a first read voltage VR1 is applied to the bit lines BL1-BL3, and a second read voltage VR2 is applied to the bit line BLn.

Because the non-volatile memory transistors 901-902 and 911-912 of the source access column 1201 are always conductive, the second read voltage VR2 applied to bit line BLn is also applied to transistor structures 904-905 of source access transistor 903, and to transistor structures 914-915 of source access transistor 913. The VDD supply voltage applied to source select line SS12 causes transistor structures 904-906, 331-333, 341-343 and 951-953 to turn on, such that the second read voltage VR2 is applied to the sources of non-volatile memory transistors 301-306. The VDD supply voltage applied to word line WL1 causes the resulting currents on bit lines BL1-BL3 to be representative of the programmed/erased states of non-volatile memory transistors 301-303. Note that even though the second read voltage VR2 is applied to the sources of non-volatile memory transistors 304-306, these transistors are turned off by the 0 Volt signal applied to word line WL2. Further note that even though the second read voltage VR2 is applied to transistor structures 914-915 of source access transistor 913, these transistor structures are turned off by the 0 Volt signal applied to source select line SS34.

Although the embodiment illustrated in FIG. 12 shows that the source access column 1201 supplies read current to three non-volatile memory transistors 301-303, it is understood that this source access column can supply read current to other numbers of memory transistors in other embodiments. For example, the source access column 1201 could be configured to provide read current to eight memory transistors (eight columns). In accordance with another embodiment, a second source access column is provided at the opposite end of the array (i.e., at the end opposite source access column 1201).

Figure 14:
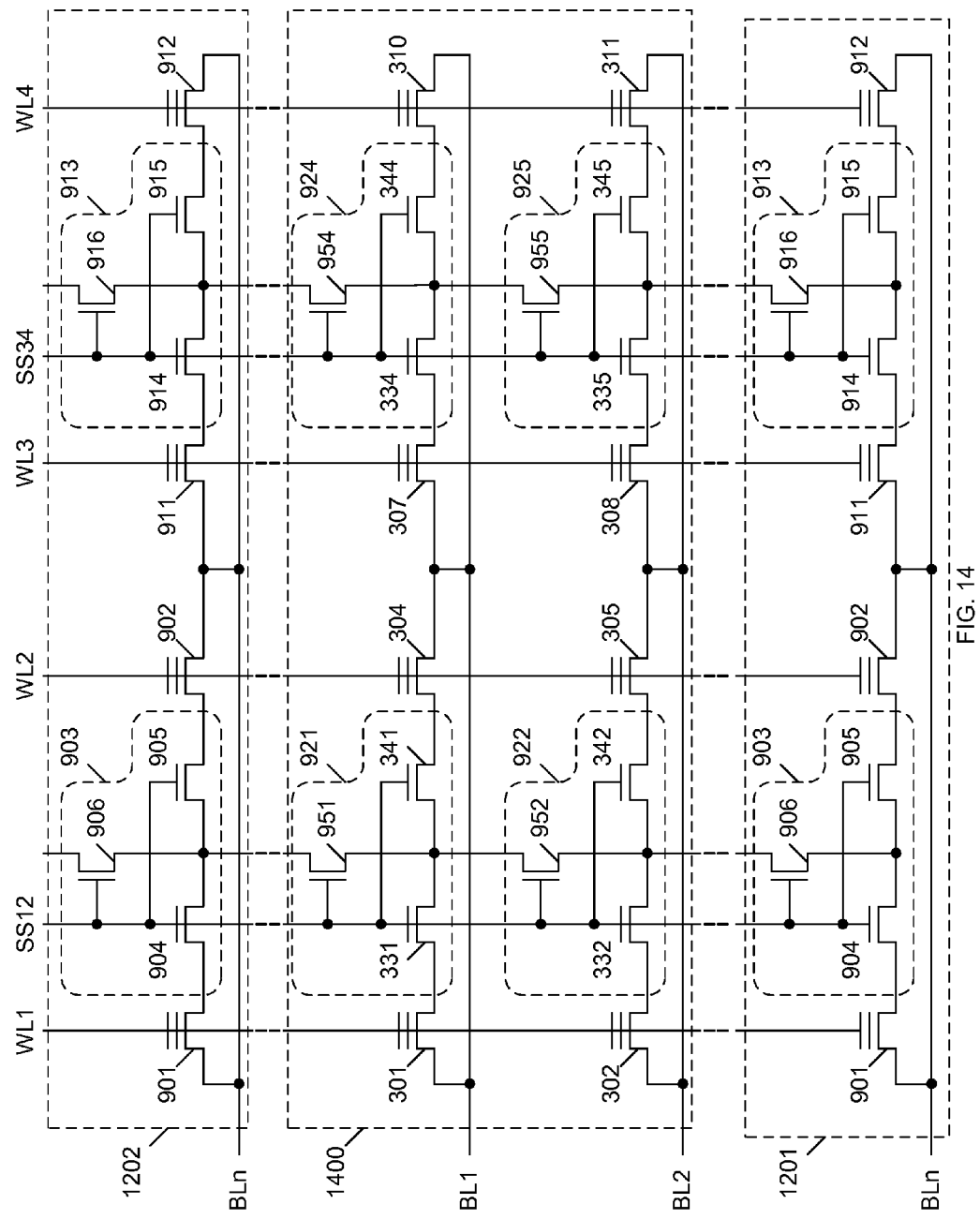
FIG. 14 is a circuit diagram illustrating a second source access column, which is added to the structure of FIG. 12 in accordance with one variation of the present invention.

FIG. 14 is a circuit diagram illustrating a second source access column 1202, which is located at the opposite end of an array 1400 (i.e., at the end opposite source access column 1201). Similar elements in source access columns 1201 and 1202 are labeled with similar reference numbers. Supplying read current from both ends of the array 1400 advantageously increases the allowable number of columns in array 1400. In one embodiment, there are sixteen columns between source access columns 1201 and 1202.

Figure 15:
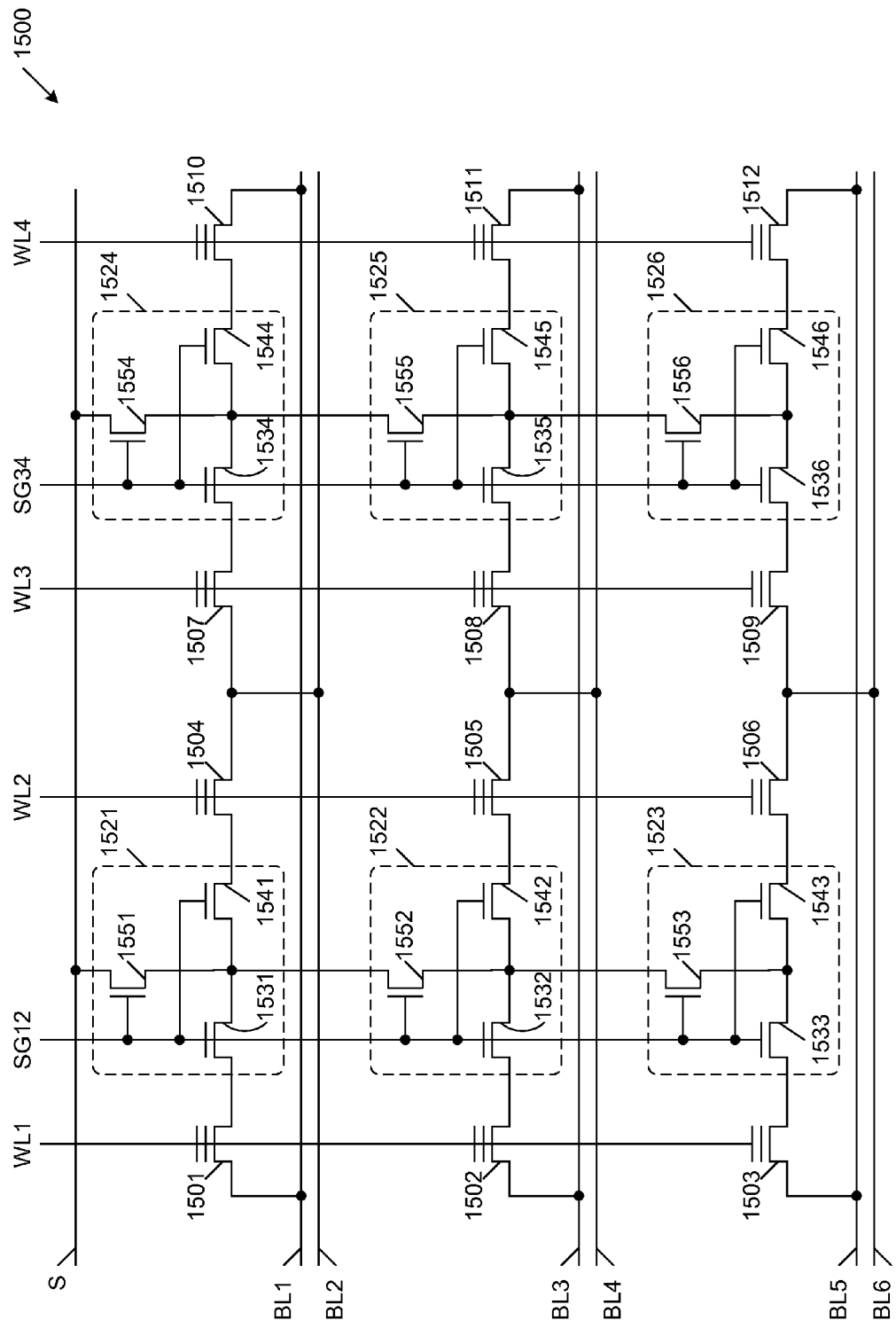
FIG. 15 is a circuit diagram of an array of EEPROM cells in accordance with another embodiment of the present invention.

FIG. 15 is a circuit diagram of an array 1500 of EEPROM cells in accordance with another embodiment of the present invention. EEPROM cell array 1500 includes floating gate non-volatile memory transistors 1501-1512, source access transistors 1521-1526, word lines WL1-WL4, bit lines BL1-BL6, common source line S and source select lines SG12 and SG34. Non-volatile memory cell transistors 1501-1512 are substantially identical to non-volatile memory transistors 301-312, which have been described above in connection with FIGS. 5A-5B and 6A-6G. Source access transistors 1521-1526 include transistor structures 1531-1536, respectively, transistor structures 1541-1546, respectively, and transistor structures 1551-1556, respectively.

In accordance with one embodiment of the present invention, EEPROM cell array 1500 has twice the bit lines as EEPROM cell array 300 (FIG. 3). The drain regions of non-volatile memory transistors 1501 and 1510 are connected to bit line BL1, and the drain regions of non-volatile memory transistors 1504 and 1507 are connected to bit line BL2. Thus, non-volatile memory transistors that share a common source access transistor are coupled to different bit lines. For example, non-volatile memory transistors 1501 and 1504, which share a common source access transistor 1521, have drain regions connected to bit lines BL1 and BL2, respectively.

The remaining bit lines BL3-BL6 are coupled in a similar manner, wherein the drain regions of non-volatile memory transistors 1502 and 1511 are connected to bit line BL3, the drain regions of non-volatile memory transistors 1505 and 1508 are connected to bit line BL4, the drain regions of non-volatile memory transistors 1503 and 1512 are connected to bit line BL5, and the drain regions of memory transistors 1506 and 1509 are connected to bit line BL6.

In the above-described configuration, each horizontal 'column' of non-volatile memory transistors/source access transistors effectively forms two 'columns' of the array 1500. For example, non-volatile memory transistors 1501 and 1510 (which are coupled to bit line BL1) are included in a first 'column' of array 1500, while non-volatile memory transistors 1504 and 1507 (which are coupled to bit line BL2) are included in a second 'column' of array 1500. In this manner, the non-volatile memory transistors in each horizontal 'column' are effectively split into two columns. This arrangement can therefore be referred to as a split (or dual) bit line configuration.

In accordance with another embodiment of the present invention, source regions of transistor structure 1551 and 1554 are connected to common source line S. As described in more detail below, common source line S allows read voltages to be applied to non-volatile memory transistors 1501-1512 in an area efficient manner.

Figure 16:
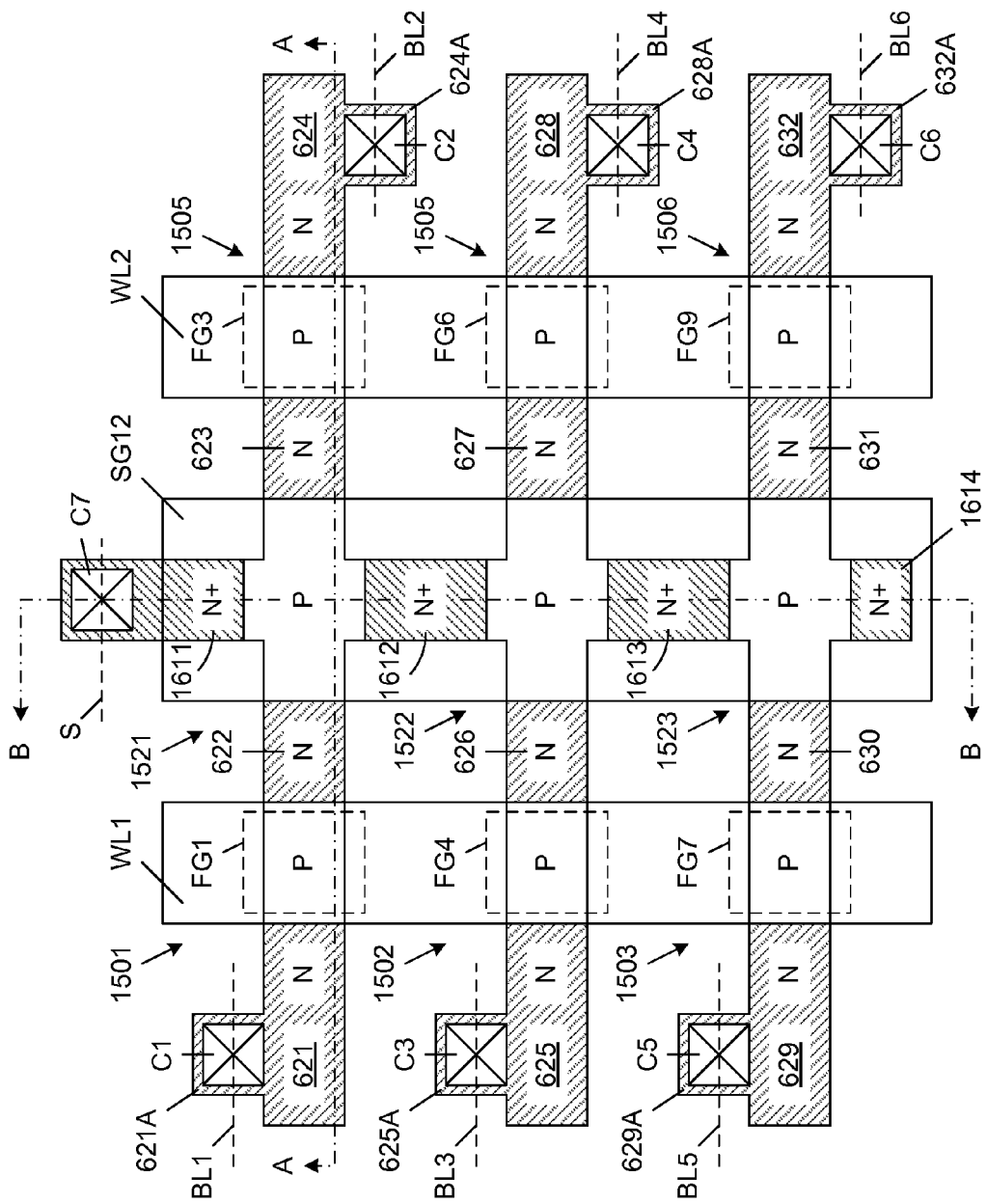
FIG. 16 is a top layout view of the first two rows of the EEPROM array of FIG. 15, in accordance with one embodiment of the present invention.

FIG. 16 is a top layout view of the first two rows of the EEPROM array of FIG. 15, including memory transistors 1501-1506, source access transistors 1521-1523, word lines WL1-WL2 and source select line SG12, in accordance with one embodiment of the present invention. The last two rows of array 1500 are laid out in the same manner as the first two rows of array 1500.

Because the array of FIG. 16 is similar to the array of FIGS. 5A-5B and 6A-6G, similar elements in these figures are labeled with similar reference numbers. Thus, the top layout view of FIG. 16 includes N-type source/drain diffusion regions 621-632, bit line contacts C1-C6 and floating gates FG1, FG3, FG4, FG6, FG7 and FG9, which have been described above in connection with FIGS. 5A-B and 6A-6G. Note that in FIG. 16, N-type source/drain diffusion regions 621, 625 and 629 include extension regions 621A, 625A and 629A, respectively, that extend a first direction (e.g., up) from the horizontal axis. Similarly, N-type source/drain diffusion regions 624, 628 and 632 include extension regions 624A, 628A and 632A, respectively, that extend an opposite direction (e.g., down) from the horizontal axis. Bit line contacts C1, C2, C3, C4, C5 and C6 contact N-type extension regions 621A, 624A, 625A, 628A, 629A and 632A, respectively, as illustrated. In this manner, the bit line contacts C1-C6 are offset along the vertical axis of FIG. 16. Bit lines BL1-BL6 are coupled to bit line contacts C1-C6, respectively. The general locations of bit lines BL1-BL6 are shown in dashed lines in FIG. 16. As illustrated, the offset bit line contacts C1-C6 allow the bit lines BL1-BL6 to extend in parallel along the horizontal axis of FIG. 16.

Bit line contact C7 contacts shallow N+ region 1611 (described below) at a location that is vertically offset from the bit line contacts C1-C6. Common source line S is coupled to bit line contact C7. The general location of common source line is shown as a dashed line in FIG. 16. As illustrated, common source line S extends in parallel with bit lines BL1-BL6 along the horizontal axis of FIG. 16, thereby providing an efficient layout for array 1500.

Figure 17A:
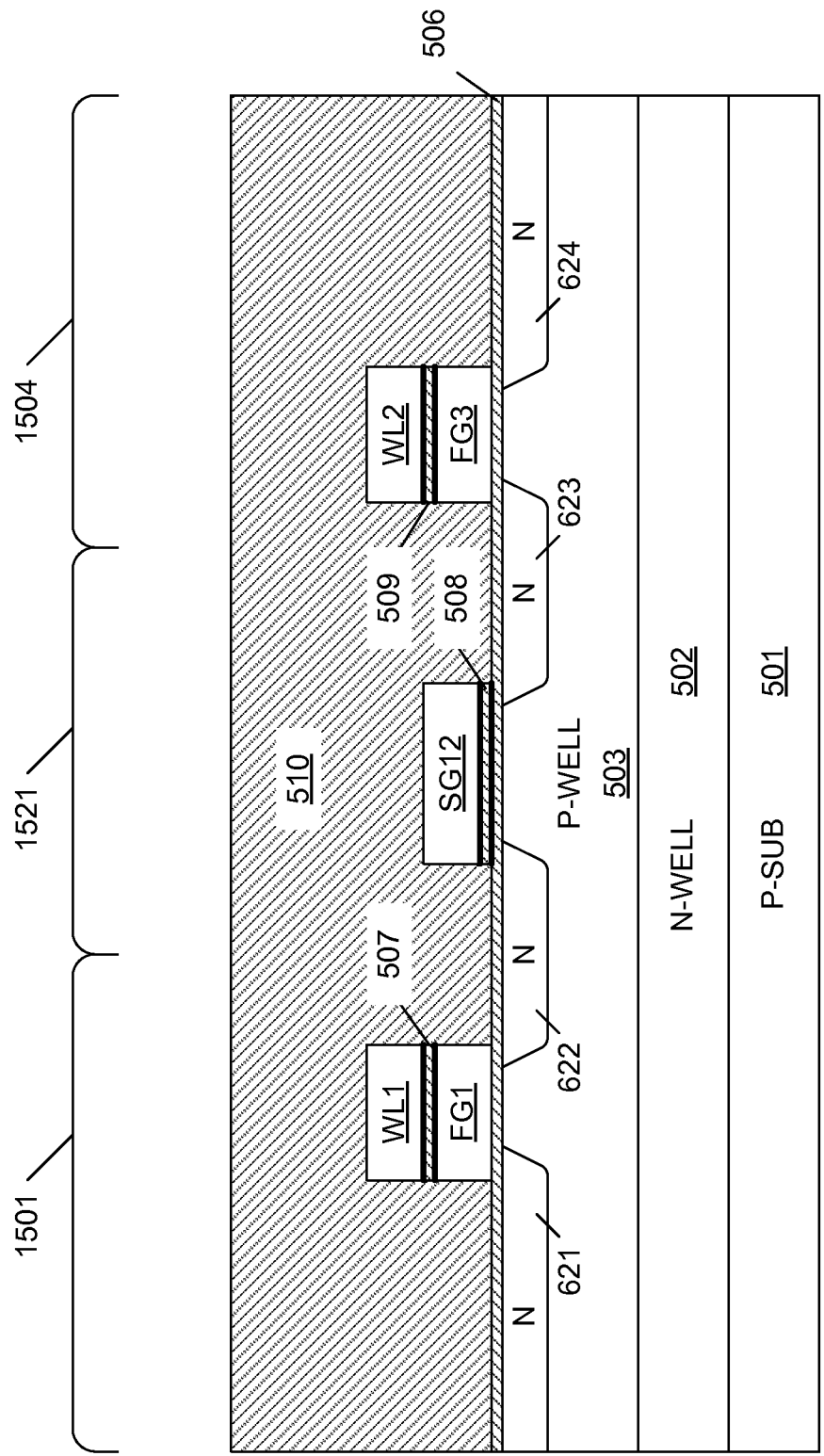
FIG. 17A is a cross-sectional view of non-volatile memory transistors and a source access transistor along section line A-A of FIG. 16.
Figure 17B:
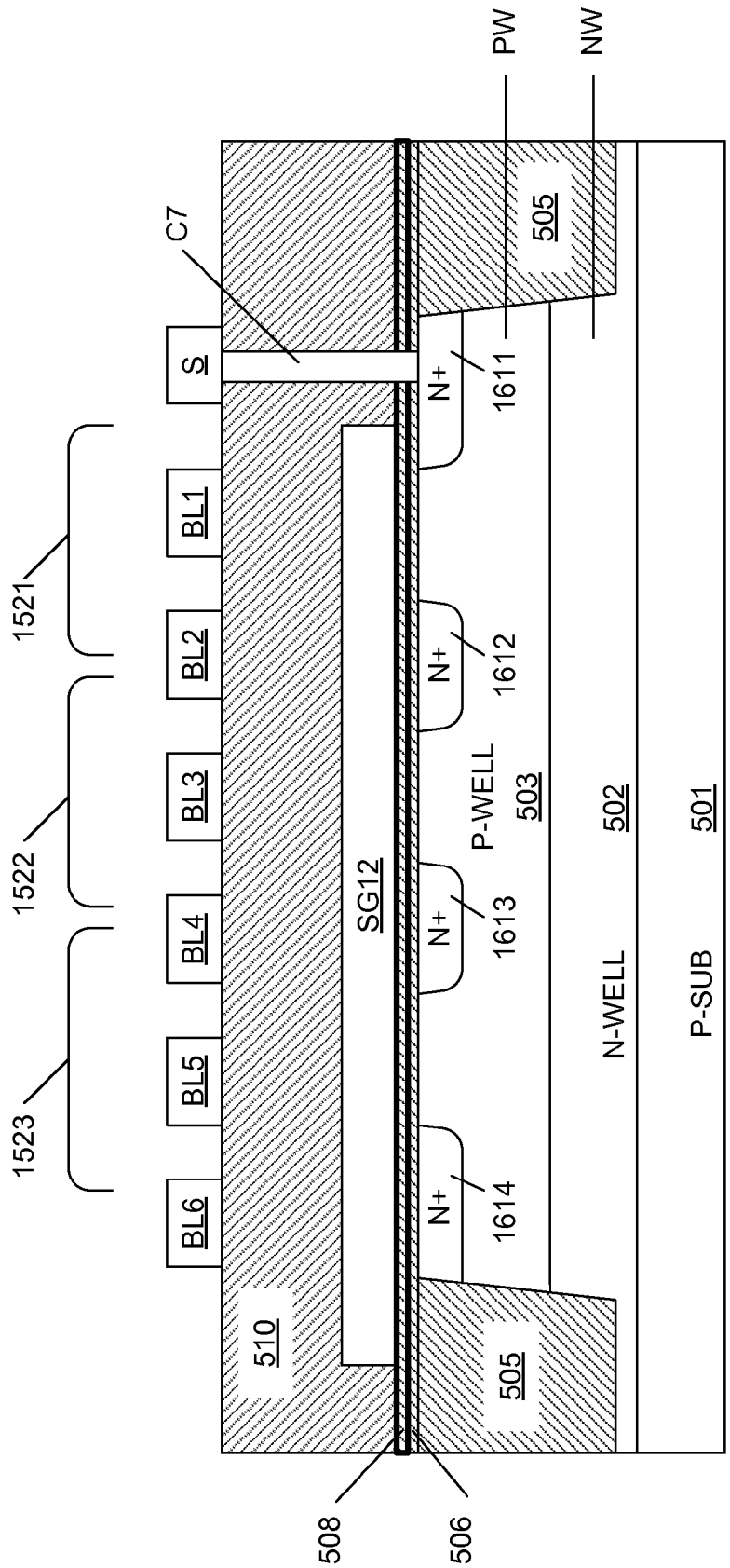
FIG. 17B is a cross-sectional view of source access transistors along section line B-B of FIG. 16.

FIG. 17A is a cross-sectional view of non-volatile memory transistors 1501 and 1504 and source access transistor 1521 along section line A-A of FIG. 16. FIG. 17B is a cross-sectional view of source access transistors 1521-1523 along section line B-B of FIG. 16. EEPROM array 1500 includes p-type substrate 501, deep N-well region 502, p-well region 503, shallow trench isolation regions 505, tunnel gate dielectric layer 506, inter-gate dielectric layers 507-509 and pre-metal dielectric 510, which have been described above in connection with FIGS. 5A-5B and 8A-8B. Note that the cross-sectional view of FIG. 17A is similar to the cross-sectional view of FIG. 8A. However, the cross-sectional view of FIG. 17A does not include the bit line contacts C1-C2 (or the bit lines BL1-BL2), as these elements are offset in the manner described above in connection with FIG. 16. Note that source select line SG12 is separated from the underlying p-well region 503 by the tunnel gate dielectric layer 506 and the inter-gate dielectric layer 508 in the manner described above in connection with FIGS. 8A-8B.

Also note that the cross-sectional view of FIG. 17B is similar to the cross-sectional view of FIG. 8B. However, the cross-sectional view of FIG. 17B does not include the deep N+ diffusion regions 611-614 of FIG. 8B. Instead, the cross-sectional view of FIG. 17B illustrates the shallow N+ diffusion region 1611-1614, which are located in the same general locations as the deep N+ diffusion regions 611-614 of FIG. 8B. In accordance with one embodiment, the shallow N+ diffusion regions 1611-1614 are formed in a manner similar to that described above for deep N+ diffusion regions 611-614, but with a lower implant dosage and energy. Shallow N+ diffusion regions 1611-1614 can be formed with a higher density than deep N+ diffusion regions 611-614, thereby enabling the array 1500 to be fabricated with a higher density (i.e., smaller layout area) than array 300.

Shallow N+ diffusion regions 1611-1614 are not continuous with deep N-well region 502. As a result, a separate connection (NW) is made to deep N-well region 502, outside the view of FIG. 17B. Yet another connection (PW) is provided to P-well region 503, also outside the view of FIG. 17B.

FIG. 17B also illustrates source line contact C7, which extends through pre-metal dielectric 510 to connect shallow N+ diffusion region 1611 and common source line S. FIG. 17B also illustrates bit lines B1-B6, which extend in parallel with common source line S.

Because the structures of FIGS. 17A-17B are similar to the structures of FIGS. 8A-8B, similar processing steps can be used to fabricate both structures. That is, the above described processing steps for fabricating the structure of FIGS. 8A-8B can be used to fabricate the structure of FIGS. 17A-17B, with differences between the methods (e.g., shallow N+ diffusion regions 1611-1614, and different bit line/source line placement) being set forth above.

Figure 18:
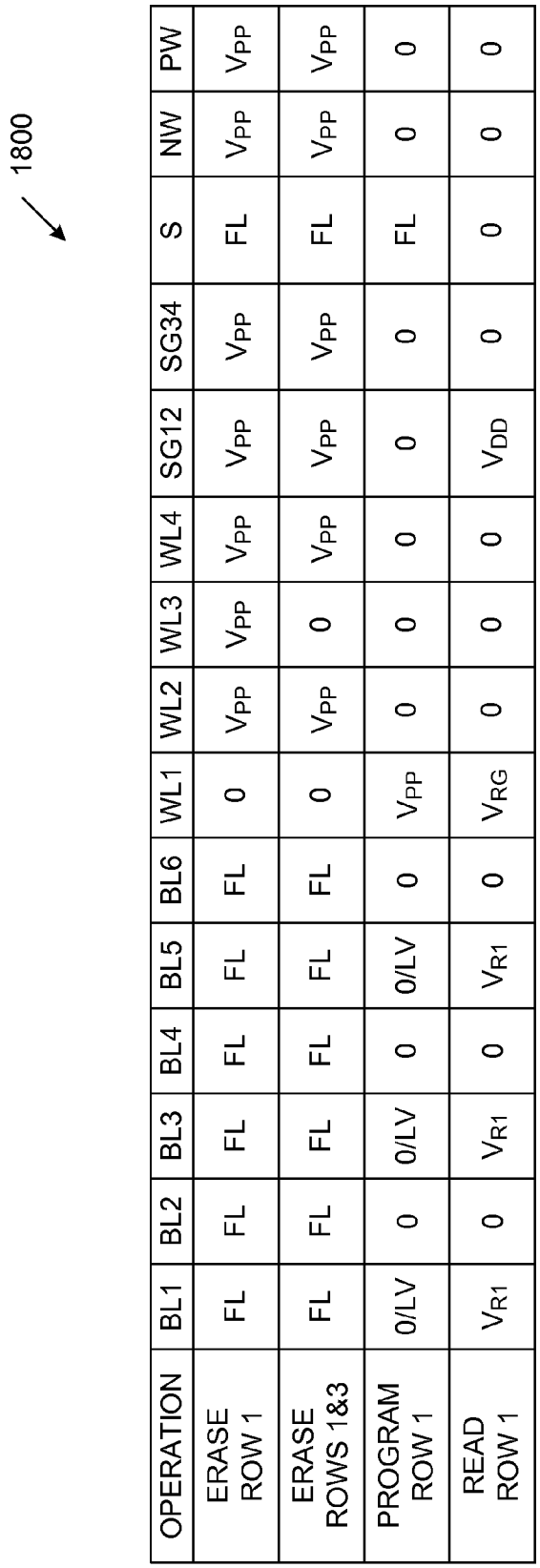
FIG. 18 is a table that summarizes erase, program and read operations implemented by the EEPROM array of FIG. 15 in accordance with one embodiment of the present invention.

The operation of EEPROM array 1500 will now be described. FIG. 18 is a table 1800 that summarizes erase, program and read operations implemented by the EEPROM array 1500 illustrated by FIGS. 15, 16, 17A and 17B in accordance with one embodiment of the present invention.

Erase operations may be performed on a per row basis. For example, to erase the first row of memory transistors 1501-1503, the control gates of these transistors are grounded by grounding word line WL1. A programming voltage $V_{PP}$ (e.g., 15 Volts) is applied to deep n-well region 502 and p-well region 503 (p-substrate 501 is grounded). The bit lines BL1-BL6 and the common source line S are left floating, and source select lines SG12 and SG34 are tied to the programming voltage $V_{PP}$. The programming voltage $V_{PP}$ is also applied to the control gates of memory transistors that are not to be erased (i.e., word lines WL2-WL4 in the present example).

Under the above-described conditions, a tunneling current flows from p-well region 503 to the floating gates (FG1, FG4 and FG7) of memory transistors 1501, 1502 and 1503. As a result, electrons are removed from the floating gates of memory transistors 1501-1503, thereby erasing these memory transistors.

Other rows of EEPROM array 300 can be erased at the same time by grounding the corresponding word line. For example, grounding word line WL3 would cause the third row of memory transistors 1507-1509 to be erased at the same time as the first row of memory transistors 1501-1503.

Programming operations will now be described. To program the first row of memory transistors 1501-1503, the programming voltage $V_{PP}$ is applied the corresponding word line WL1, and the corresponding bit lines BL1, BL3 and BL5 are either grounded (to inject electrons to the corresponding floating gates FG1, FG4 and FG7), or are held at an intermediate voltage LV (that prevents electrons from being injected to the corresponding floating gates FG1, FG4 and FG7). Deep n-well region 502, p-well region 503, source select lines SG12-SG34, non-selected word lines WL2-WL4, and bit lines BL2, BL4 and BL6 (which are not coupled to memory cells in the row being programmed) are also grounded. The common source line S is allowed to float. Under these conditions, a tunneling current flows between p-well region 503 and the floating gates of memory transistors 1501-1503 having grounded bit lines BL1, BL3, BL5. Conversely, no significant tunneling current flows between p-well region 503 and the floating gates of memory transistors 1501-1503 having bit lines BL1, BL3, BL5 coupled to the intermediate voltage LV (e.g., 3-5 Volts), because the intermediate voltage LV inhibits tunneling current in these memory transistors.

Thus, if bit lines BL1 and BL2 are grounded during the above-described programming operation, tunneling current flows in memory transistors 1501 and 1502, such that electrons are injected into the floating gates FG1 and FG4, thereby programming these memory transistors 1501 and 1502. If bit line BL3 is held at the intermediate voltage LV during the above-described programming operation, tunneling current does not flow in memory transistor 1503, such that electrons are not injected unto the floating gate FG7 of memory transistor 1503 during the programming operation.

Note that grounding word lines WL2-WL4 prevents memory transistors 1504-1512 from being programmed at the same time as memory transistors 1501-1503. More specifically, grounding word lines WL2-WL4 inhibits tunneling current in these memory transistors 1502-1512. However, note that memory transistors 1504-1512 can be programmed at the same time as memory transistors 1501-1512 by applying the programming voltage $V_{PP}$ to the corresponding word line(s) and applying the appropriate voltages (0/LV) to the bit lines BL1-BL6.

Advantageously, the high programming voltage $V_{PP}$ is not applied to the drain junctions of memory transistors 1501-1512 during erase and program operations. Furthermore, the high programming voltage $V_{PP}$ is not applied across bit lines BL1-BL6 and p-well region 503 or n-well region 502. Moreover, the high programming voltage $V_{PP}$ is not applied across source select lines SG12-SG34 and p-well region 503 or n-well region 504. Consequently, the source access transistors 1521-1526 and memory transistors 1501-1513 may be scaled to sub-0.35 micron processes.

Read operations are performed on a per row basis. For example, the first row of memory transistors 1501-1503 is read as follows. A first read voltage $V_{R1}$ of about 0.5 to 1.5 Volts, depending on the sense amplifier design, is applied to each of the bit lines BL1, BL3 and BL5 associated with the first row. The $V_{DD}$ supply voltage (about 2.5 Volts) is applied to the source select line SG12 associated with the first row, and a second read voltage $V_{RG}$ (about 1.5 Volts) is applied to the word line WL1 associated with the first row. Non-selected word lines WL2-WL4, source select line SG34, p-well region 503, deep n-well region 503, and the bit lines not associated with the first row (i.e., bit lines BL2, BL4 and BL6) are grounded. The common source line S is also grounded. Under these conditions, significant read current will flow through erased memory transistors in the first row, while no significant read current will flow through programmed memory transistors in the first row. Sense amplifiers coupled to bit lines BL1, BL3 and BL5 identify the read currents flowing through memory transistors 1501-1503 (and therefore the logic states of the bits stored by these memory transistors). Note that the $V_{DD}$ supply voltage applied to source select line SG12 turns on source access transistors 1521-1523, such that the 0 Volt signal applied to the common source line S is provided to the sources of memory transistors 1501-1503. Read current flowing through an erased memory transistor therefore flows from the associated bit line to the common source line S.

It is important to note that the memory transistors 1504-1506, which share source access transistors 1521-1523 with the memory transistors 1501-1503 being read, do not adversely effect the read currents through memory transistors 1501-1503. Note that the drains of memory transistors 1504, 1505 and 1506 are grounded through independent bit lines BL2, BL4 and BL6 while memory transistors 1501-1503 are being read. As a result, the sources, drains and control gates of memory transistors 1504-1506 are all held at 0 Volts while memory transistor 1501-1503 are being read, such that no current flows through memory transistors 1504-1506 at this time. Moreover, even if currents were to flow through memory transistors 1504-1506 while memory transistors 1501-1503 were being read, these currents would not adversely effect the sense amplifiers coupled to the independent bit lines BL1, BL3 and BL5.

Note that without independent bit lines BL2, BL4 and BL6, memory transistors 1504-1506 would share the same bit lines (BL1, BL3 and BL5) with memory transistors 1501-1503. In this case, the drains of memory transistors 1504-1506 would be held at the same voltage (i.e., $V_{R1}$) as memory transistors 1501-1503 (through bit lines BL1, BL3 and BL5), potentially resulting in some current flow through these memory transistors 1504-1506 to the shared bit lines, thereby adversely effecting the read currents on these shared bit lines. Splitting the bit lines BL1-BL6 in the manner described above eliminates this potential problem.

Figure 19:
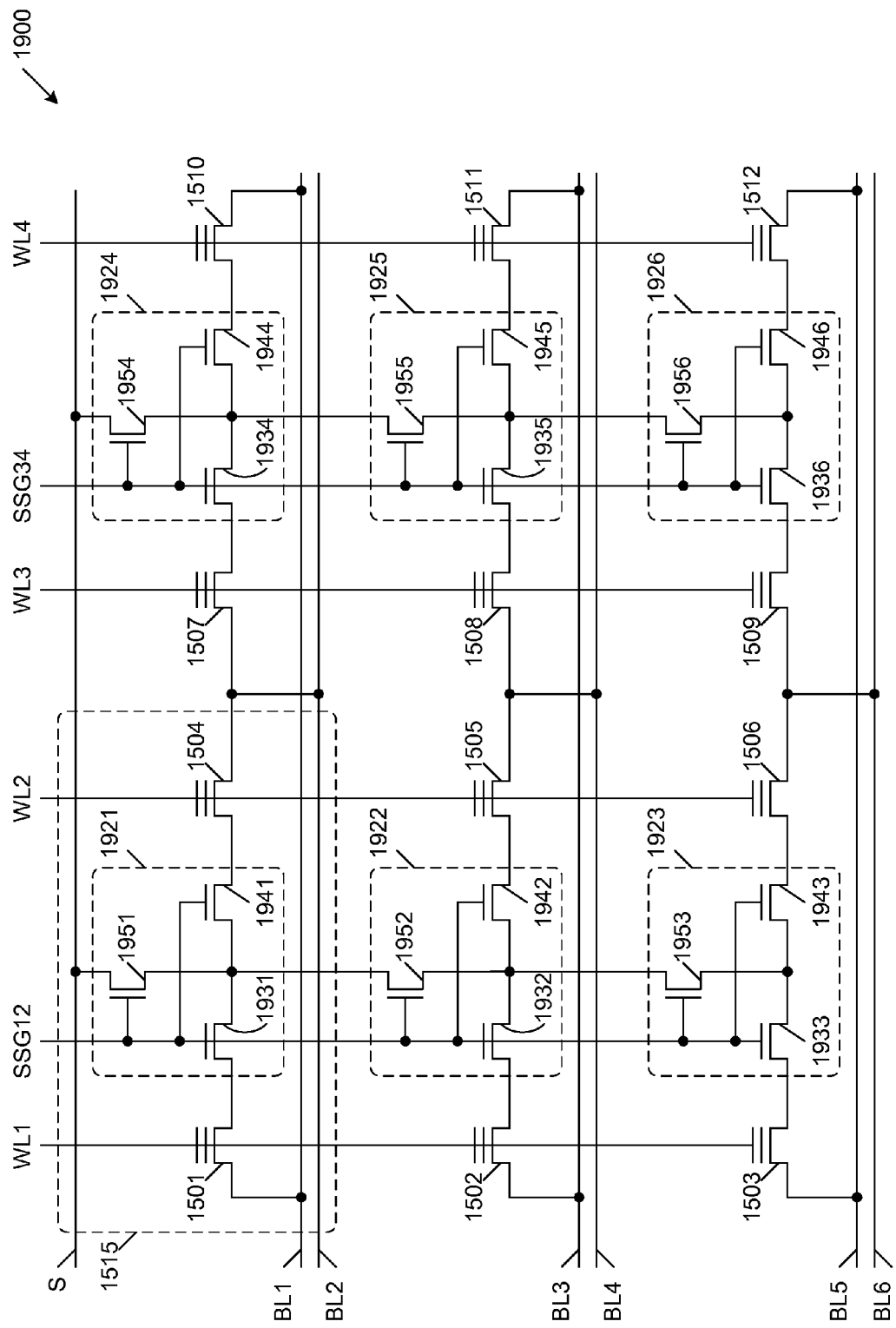
FIG. 19 is a circuit diagram of an array of EEPROM cells in accordance with yet another embodiment of the present invention.

FIG. 19 is a circuit diagram of an array 1900 of EEPROM cells in accordance with yet another embodiment of the present invention. Because EEPROM cell array 1900 is similar to EEPROM cell array 1500, similar elements in FIGS. 19 and 15 are labeled with similar reference numbers. Thus, EEPROM cell array 1900 includes floating gate non-volatile memory transistors 1501-1512, word lines WL1-WL4, bit lines BL1-BL6 and common source line S, which have been described above in connection with FIG. 15. EEPROM cell array 1900 also includes source access transistors 1921-1926, which replace the source access transistors 1521-1526 of EEPROM cell array 1900. Source access transistors 1921-1926 include transistor structures 1931-1936, respectively, transistor structures 1941-1946, respectively, and transistor structures 1951-1956, respectively. Source regions of transistor structures 1951 and 1954 are coupled to common source line S, as illustrated. Source access transistors 1921-1923 share a common source select line SSG12, and source access transistors 1923-1926 share a common source select line SSG34.

Figure 20:
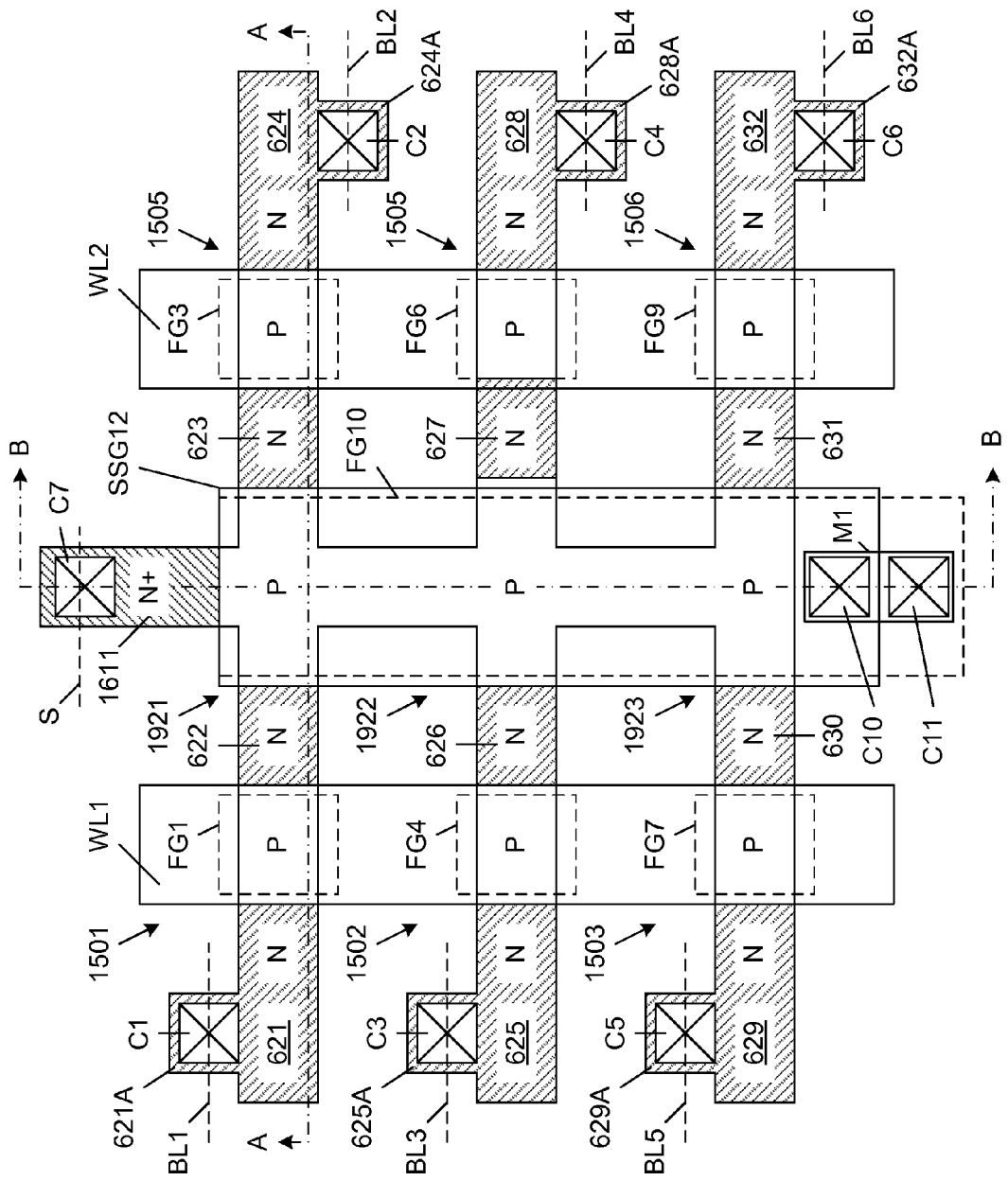
FIG. 20 is a top layout view of the first two rows of the EEPROM array of FIG. 19, in accordance with one embodiment of the present invention.

FIG. 20 is a top layout view of the first two rows of the EEPROM array of FIG. 19, including memory transistors 1501-1506, source access transistors 1921-1923, word lines WL1-WL2 and source select line SSG12, in accordance with one embodiment of the present invention. The last two rows of array 1900 are laid out in the same manner as the first two rows of array 1900.

Because the array of FIG. 20 is similar to the array of FIG. 16, similar elements in these figures are labeled with similar reference numbers. Thus, the top layout view of FIG. 20 includes N-type source/drain diffusion regions 621-632, bit line contacts C1-C7, shallow N+ diffusion region 1611, and floating gates FG1, FG3, FG4, FG6, FG7 and FG9, which have been described above. In addition, FIG. 20 illustrates source select line SSG12, floating gate FG10, contacts C10-C11 and metal trace M1.

Figure 21A:
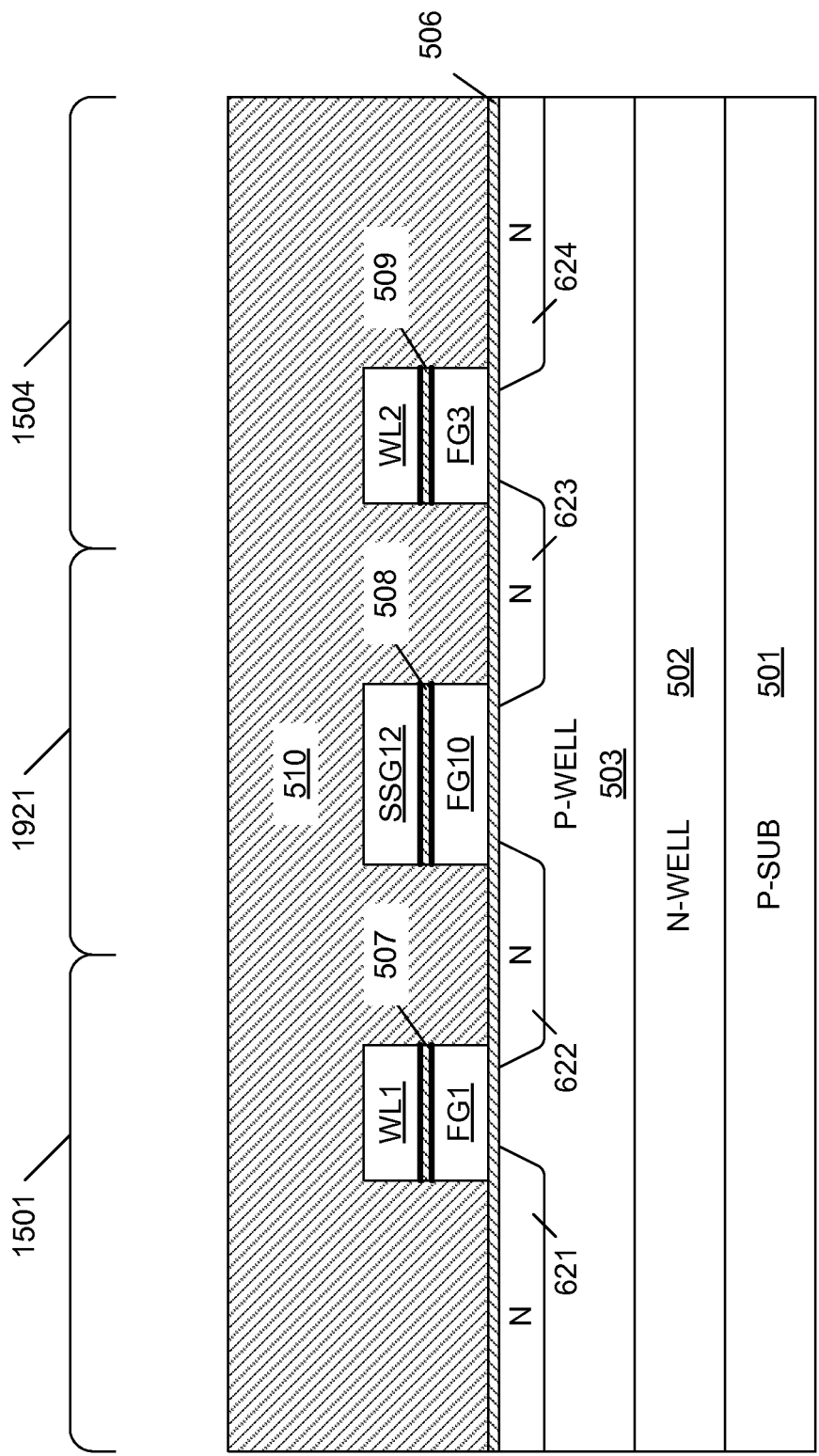
FIG. 21A is a cross-sectional view of non-volatile memory transistors and a source access transistor along section line A-A of FIG. 20.
Figure 21B:
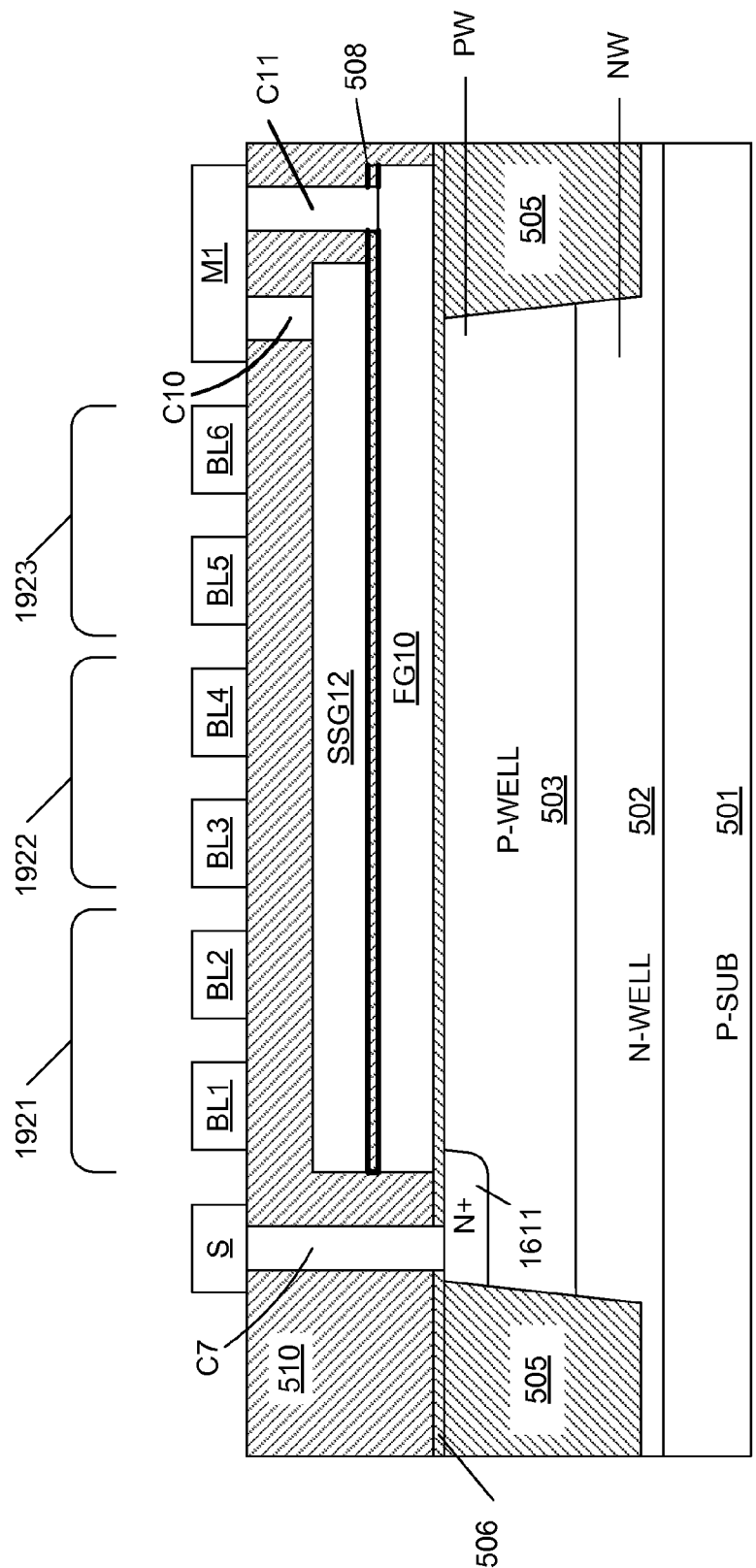
FIG. 21B is a cross-sectional view of source access transistors along section line B-B of FIG. 20.

FIG. 21A is a cross-sectional view of non-volatile memory transistors 1501 and 1504 and source access transistor 1921 along section line A-A of FIG. 20. FIG. 21B is a cross-sectional view of source access transistors 1921-1923 along section line B-B of FIG. 20. EEPROM array 1500 includes p-type substrate 501, deep N-well region 502, p-well region 503, shallow trench isolation regions 505, tunnel gate dielectric layer 506, inter-gate dielectric layers 507-509 and pre-metal dielectric 510, which have been described above. Note that the cross-sectional view of FIG. 21A is similar to the cross-sectional view of FIG. 10A. However, the cross-sectional view of FIG. 21A does not include the bit line contacts C1-C2 (or the bit lines BL1-BL2), as these elements are offset in the manner described above.

Also note that the cross-sectional view of FIG. 21B is similar to the cross-sectional view of FIG. 10B. However, the cross-sectional view of FIG. 21B includes shallow N+ diffusion region 1611, which is connected to common source line S by contact C7. Separate connections are made to deep N-well region 502 (NW) and P-well region 503 (PW), outside the view of FIG. 21B.

As also illustrated by FIG. 21B, floating gate FG10 is formed over tunnel gate dielectric layer 506, inter-gate dielectric layer 508 is formed over floating gate FG10, and source select line SSG12 is formed over inter-gate dielectric layer 508. Source select line SSG12 is electrically connected to floating gate FG10 by contacts C10-C11 and metal trace M1, in the manner described above in connection with FIG. 10B.

Because the structure of FIGS. 21A-21B is similar to the structure of FIGS. 10A-10B, similar processing steps can be used to fabricate both structures. That is, the above described processing steps for fabricating the structure of FIGS. 10A-10B can be used to fabricate the structure of FIGS. 21A-21B, with differences between the methods (e.g., the formation of shallow N+ diffusion region 1611, and different bit line/source line placement) being set forth above. Note that shallow N+ diffusion region 1611 is implanted in alignment with source select line SSG12 and floating gate FG10.

In accordance with one embodiment, the EEPROM array 1900 is operated in the same manner as the EEPROM array 1500. That is, the erase, program and read operations described above in connection with FIG. 18 are also used to operate EEPROM array 1900.

Although the split (dual) bit line configuration implemented by the EEPROM arrays of FIGS. 15 and 19 have been described in connection with embodiments that include the common source line S, it is understood that the split bit line configuration of the present invention can also be used in connection with the EEPROM arrays of other embodiments of the present invention (i.e., the EEPROM arrays described above in connection with FIGS. 3 to 14).

Figure 22:
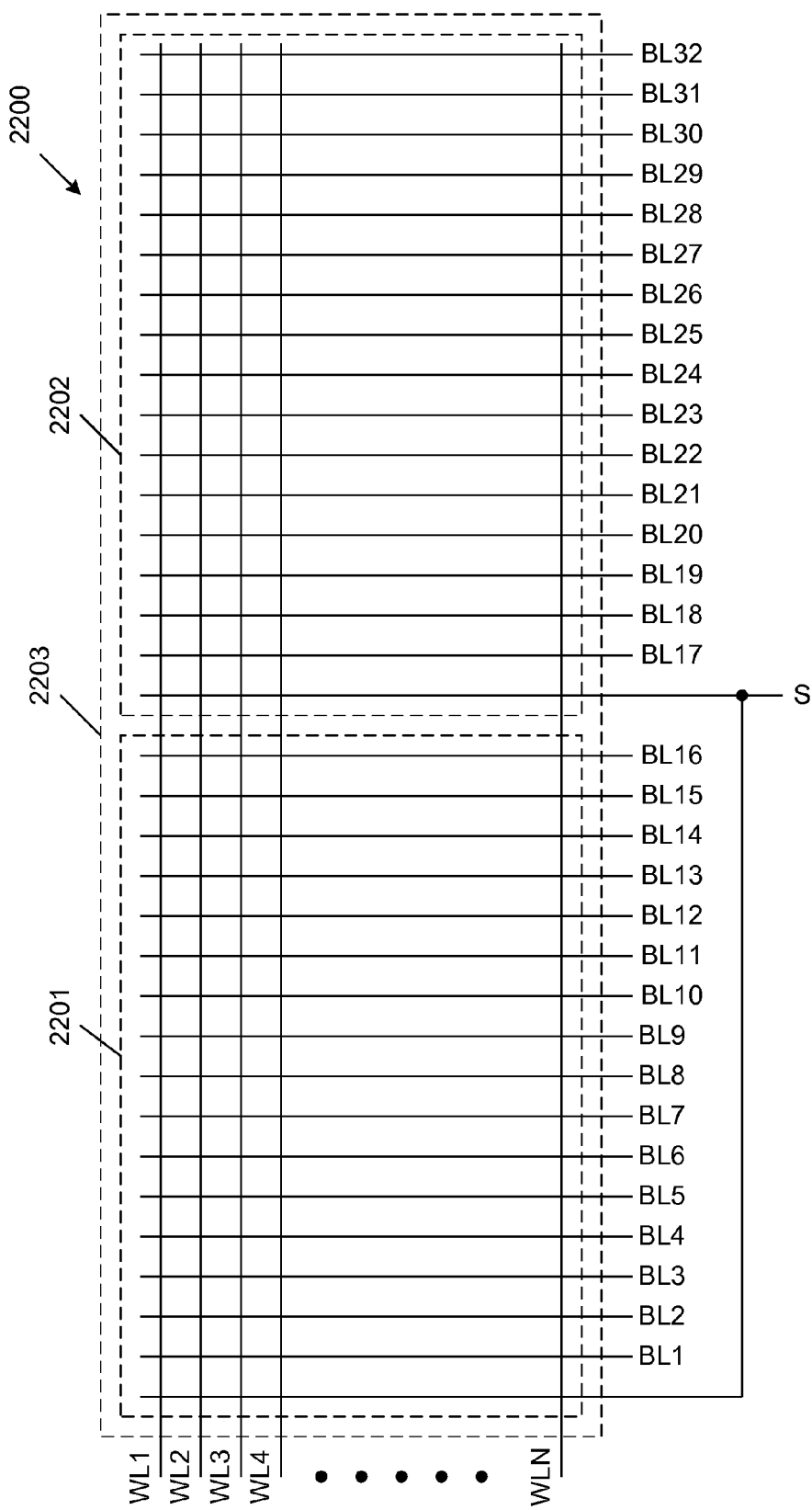
FIG. 22 is a block diagram illustrating an EEPROM array that includes a first set of memory transistors fabricated in a first p-well region, and a second set of memory transistors fabricated in a second p-well region, in accordance with another embodiment of the present invention.

Although EEPROM arrays 1500 and 1900 have been described as arrays having a single p-well region 503, it is understood that multiple isolated p-well regions (similar to p-well region 503) can be implemented, wherein different blocks of non-volatile memory transistors are fabricated in different p-well regions. FIG. 22 is a block diagram illustrating an EEPROM array 2200 that includes a first set of memory transistors fabricated in a first p-well region 2201, and a second set of memory transistors fabricated in a second p-well region 2202. The p-well regions 2201-2202 are fabricated in a deep n-well region 2203, which isolates the p-well regions 2201-2202. Note that shallow N+ diffusion regions, similar to shallow N+ diffusion region 1611, are present within each of the P-well regions 2201-2202. The common source line S is connected to these shallow N+ diffusion regions within P-well regions 2201-2202 in the manner described above. EEPROM array 2200 includes word lines WL1-WLN and bit lines BL1-BL32, wherein memory transistors (described above) are located at the intersections of the word lines and the bit lines. The source select lines are not shown in FIG. 22 for clarity. Odd word lines (e.g., WL1, WL3) access memory transistors coupled to odd bit lines (e.g., BL1, BL3), and even word lines (e.g., WL2, WL4) access memory transistors coupled to even bit lines (e.g., BL2, BL4), in the manner described above in connection with EEPROM arrays 1500 and 1900. In the example of FIG. 22, EEPROM array 2200 has a byte width of 8-bits.

The separate p-well regions 2201 and 2202 allow erase operations to be performed on a per byte basis. For example, to erase the memory transistors coupled to word line WL1 and bit lines BL1, BL3, BL5, BL7, BL9, BL11, BL13 and BL15 (i.e., the first byte of row 1), the erase voltages defined by FIG. 18 are applied to the various elements of the array, including p-well region 2201. A simultaneous erase of the memory transistors coupled to word line WL1 and bit lines BL17, BL19, BL21, BL23, BL25, BL27, BL29 and BL31 (i.e., the second byte of row 1) can be prevented by applying an intermediate voltage of about 4 Volts to the p-well region 2202.

Although the present invention has been described in connection with particular embodiments, it is understood that variations in these embodiments would be apparent to one of ordinary skill in the art. Thus, the present invention is only limited by the following claims.

We claim:

1. A non-volatile memory array comprising:
   a first bit line;
   a second bit line; and
   an electrically erasable and programmable memory (EEPROM) cell pair that includes:
      a first non-volatile memory transistor having a drain connected to the first bit line, and floating gate structure separated from a control gate structure by an inter-gate dielectric layer;
      a second non-volatile memory transistor having a drain connected to the second bit line, and a floating gate structure separated from a control gate structure by an inter-gate dielectric layer; and
      a source access transistor having a control gate structure, a first diffusion region continuous with a source of the first non-volatile memory transistor, a second diffusion region continuous with a source of the second non-volatile memory transistor, and a third diffusion region separate from the first and second diffusion regions.

2. The non-volatile memory array of claim 1, wherein the EEPROM cell pair is located in a first well region, wherein the third diffusion region does not extend entirely through the first well region.

3. The non-volatile memory array of claim 1, further comprising:
   a first well region, wherein the EEPROM cell pair is located in the first well region; and
   a second well region, wherein the first well region is located in the second well region, wherein the third diffusion region is isolated from the second well region.

4. The non-volatile memory array of claim 1, wherein the source access transistor does not include a floating gate structure.

5. The non-volatile memory array of claim 1, wherein the source access transistor includes a floating gate structure that is electrically connected to the control gate structure of the source access transistor.

6. The non-volatile memory array of claim 1, further comprising a common source line connected to the third diffusion region of the source access transistor, wherein the first bit line, the second bit line and the common source line extend in parallel along a first axis.

7. The non-volatile memory array of claim 1, wherein the only transistors in the EEPROM cell pair are the first non-volatile memory transistor, the second non-volatile memory transistor and the source access transistor.

8. The non-volatile memory array of claim 1, further comprising:
   a first well region, wherein the EEPROM cell pair is located in the first well region; and
   a tunnel gate dielectric layer separating the floating gate structures of the first and second non-volatile memory transistors from the first well region, and separating the control gate structure of the source access transistor from the first well region.

9. The non-volatile memory array of claim 8, further comprising an inter-gate dielectric layer separating the control gate structure of the source access transistor from the first well region.

10. The non-volatile memory array of claim 1, wherein the source access transistor further comprises a floating gate structure, wherein an inter-gate dielectric layer is located between the floating gate structure of the source access transistor and the control gate structure of the source access transistor.

11. The non-volatile memory array of claim 1, further comprising:
    a first word line coupled to the control gate structure of the first non-volatile memory transistor; and
    a second word line coupled to the control gate structure of the second non-volatile memory transistor; and
    a source select line coupled to the control gate structure of the source access transistor.

12. The non-volatile memory array of claim 11, wherein the first word line, the second word line and the source select line extend in parallel along a first axis.

13. A non-volatile memory array comprising:
    a first row comprising a first plurality of non-volatile memory transistors;
    a first set of bit lines connected to the first plurality of non-volatile memory transistors in the first row;
    a second row comprising a second plurality of non-volatile memory transistors;
    a second set of bit lines, separate from the first set of bit lines, connected to the second plurality of non-volatile memory transistors in the second row; and
    a plurality of source access transistors, each having a first diffusion region continuous with a source region of a corresponding one of the first plurality of non volatile memory transistors in the first row, and each having a second diffusion region continuous with a source region of a corresponding one of the second plurality of non-volatile memory transistors in the second row.

14. The non-volatile memory array of claim 13, wherein the plurality of source access transistors comprise a floating gate structure and a control gate structure, wherein the floating gate structure is electrically connected to the control gate structure.

15. The non-volatile memory array of claim 14, wherein the floating gate structure is continuous along the plurality of source access transistors.

16. The non-volatile memory array of claim 14, further comprising an inter-gate dielectric layer located between portions of the floating gate structure and the control gate structure.

17. The non-volatile memory array of claim 13, further comprising a common source line connected to a third diffusion region of one of the source access transistors.

18. The non-volatile memory array of claim 17, wherein the first set of bit lines, the second set of bit lines and the common source line extend in parallel along a first axis.

* * * * *